(12) United States Patent
Sanda et al.

(10) Patent No.: US 12,477,704 B2
(45) Date of Patent: Nov. 18, 2025

(54) POWER SEMICONDUCTOR DEVICE AND METHOD OF MANUFACTURING THE SAME, AND POWER CONVERSION DEVICE

(71) Applicant: Mitsubishi Electric Corporation, Tokyo (JP)

(72) Inventors: Yasuyuki Sanda, Tokyo (JP); Masaki Goto, Tokyo (JP); Hayato Terada, Tokyo (JP); Hodaka Rokubuichi, Tokyo (JP); Haruna Tada, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 286 days.

(21) Appl. No.: 18/258,037

(22) PCT Filed: Jan. 14, 2022

(86) PCT No.: PCT/JP2022/001154
§ 371 (c)(1),
(2) Date: Jun. 16, 2023

(87) PCT Pub. No.: WO2022/158392
PCT Pub. Date: Jul. 28, 2022

(65) Prior Publication Data
US 2024/0074122 A1    Feb. 29, 2024

(30) Foreign Application Priority Data
Jan. 22, 2021 (JP) ................. 2021-008385

(51) Int. Cl.
*H05K 7/20* (2006.01)
*H01L 21/48* (2006.01)
(Continued)

(52) U.S. Cl.
CPC ......... *H05K 7/209* (2013.01); *H01L 21/4878* (2013.01); *H01L 21/4882* (2013.01);
(Continued)

(58) Field of Classification Search
CPC ............ H01L 23/3107; H01L 23/3121; H01L 23/3142; H01L 23/367; H01L 23/3672;
(Continued)

(56) References Cited

U.S. PATENT DOCUMENTS 8,643,171 B1    2/2014 Nakazato et al.
9,554,458 B2 *  1/2017 Knörr ...................... B23K 1/08
(Continued)

FOREIGN PATENT DOCUMENTS

JP    H06005750 A    1/1994
JP    2011155118 A   8/2011
(Continued)

OTHER PUBLICATIONS

International Search Report (PCT/ISA/210) with translation and Written Opinion (PCT/ISA/237) mailed on Sep. 6, 2022, by the Japan Patent Office as the International Searching Authority for International Application No. PCT/JP2022/023763. (8 pages).
(Continued)

*Primary Examiner* — Amir A Jalali
(74) *Attorney, Agent, or Firm* — Buchanan Ingersoll & Rooney PC

(57) ABSTRACT

A power semiconductor device includes a power module unit and a heat sink. An uneven portion is formed in a module base in the power module unit. The uneven portion includes a depression portion and a buffer depression portion. An uneven portion is formed in a heat sink base unit in the heat sink. The uneven portion and the uneven portion are fitted together by crimping so that the module base of the power module unit and a heat dissipation spreader of the heat sink are integrated. The buffer depression portion is left as a space.

14 Claims, 27 Drawing Sheets

(51) Int. Cl.
*H01L 21/56* (2006.01)
*H01L 23/31* (2006.01)
*H01L 23/367* (2006.01)

(52) U.S. Cl.
CPC ........ *H01L 21/565* (2013.01); *H01L 23/3142* (2013.01); *H01L 23/367* (2013.01); *H05K 7/20418* (2013.01)

(58) Field of Classification Search
CPC ............. H01L 23/3675; H01L 23/3677; H01L 23/49575; H01L 23/49568; H01L 21/4871; H01L 21/4878; H01L 21/4882; H01L 21/56; H01L 21/565; H01L 25/072; H01L 2924/1815; H01L 2924/183; H05K 7/20; H05K 7/2039–20418; H05K 7/20509; H05K 7/209
See application file for complete search history.

(56) References Cited

U.S. PATENT DOCUMENTS

| | | | |
|---|---|---|---|
| 10,297,524 B2 * | 5/2019 | Watanabe | H01L 21/4882 |
| 2002/0070005 A1 * | 6/2002 | Kawabata | B21D 53/02 |
| | | | 29/890.03 |
| 2007/0035008 A1 * | 2/2007 | Wu | H01L 23/3107 |
| | | | 257/E29.022 |
| 2012/0227952 A1 * | 9/2012 | Yoshihara | F28F 3/02 |
| | | | 165/185 |
| 2014/0035122 A1 | 2/2014 | Nakazato et al. | |
| 2014/0367702 A1 * | 12/2014 | Yamamoto | H01L 21/4882 |
| | | | 257/77 |
| 2016/0225691 A1 * | 8/2016 | Sanda | H01L 23/3672 |
| 2016/0300785 A1 * | 10/2016 | Kimura | H01L 23/4334 |
| 2019/0295919 A1 * | 9/2019 | Sanda | H01L 25/072 |
| 2020/0043824 A1 * | 2/2020 | Tada | H01L 23/40 |
| 2022/0077033 A1 | 3/2022 | Tsukiyama et al. | |

FOREIGN PATENT DOCUMENTS

| | | |
|---|---|---|
| JP | 5236127 B1 | 7/2013 |
| JP | 2013165122 A | 8/2013 |
| JP | 5373688 B2 | 9/2013 |
| JP | 5418601 B2 | 11/2013 |
| JP | 5432085 B2 | 12/2013 |
| JP | 6009209 B2 | 9/2016 |
| JP | 6091633 B2 | 2/2017 |
| WO | 2018079396 A1 | 5/2018 |
| WO | 2018097027 A1 | 5/2018 |
| WO | 2020261730 A1 | 12/2020 |

OTHER PUBLICATIONS

International Search Report (PCT/ISA/210) with translation and Written Opinion (PCT/ISA/237) mailed on Mar. 29, 2022, by the Japan Patent Office as the International Searching Authority for International Application No. PCT/JP2022/001154. (8 pages).

* cited by examiner

POWER SEMICONDUCTOR DEVICE AND METHOD OF MANUFACTURING THE SAME, AND POWER CONVERSION DEVICE

TECHNICAL FIELD

The present disclosure relates to a power semiconductor device and a method of manufacturing the same, and a power conversion device.

BACKGROUND ART

As one form of power semiconductor devices including power semiconductor elements, a heat sink-integrated power semiconductor module has been proposed in which a power module unit provided with a power semiconductor element is integrated with a heat sink (PTL 1 to PTL 10).

CITATION LIST

Patent Literature

PTL 1: Japanese Patent No. 5236127
PTL 2: Japanese Patent No. 5373688
PTL 3: Japanese Patent No. 5418601
PTL 4: Japanese Patent No. 5432085
PTL 5: Japanese Patent No. 6009209
PTL 6: Japanese Patent No. 6091633
PTL 7: Japanese Patent Laying-Open No. H06-5750
PTL 8: Japanese Patent Laying-Open No. 2011-155118
PTL 9: WO2018-079396
PTL 10: WO2018-097027

SUMMARY OF INVENTION

Technical Problem

In heat sink-integrated power semiconductor modules as power semiconductor devices, further improvement in productivity in integrating the power module unit and the heat sink has been demanded.

The present disclosure is made as a part of such development. One object of the present disclosure is to provide a power semiconductor device that can achieve further improvement in productivity. Another object is to provide a method of manufacturing such a power semiconductor device. Yet another object is to provide a power conversion device to which such a power semiconductor device is applied.

Solution to Problem

A power semiconductor device according to the present disclosure includes a power module unit, a heat sink base unit, and a plurality of radiating fins. The power module unit has a module base having a first uneven portion and has a power semiconductor element mounted on the module base and sealed by a sealing material. The heat sink base unit has a second uneven portion and is bonded to the module base such that the second uneven portion and the first uneven portion are fitted together. The radiating fins are attached to the heat sink base unit. The module base and the heat sink base unit are formed such that one of the first uneven portion and the second uneven portion has a buffer depression portion left as a space in a state in which the module base and the heat sink base unit are bonded to each other.

A method of manufacturing a power semiconductor device according to the present disclosure includes the following steps. A module base having a first uneven portion is prepared. A power module unit is formed by mounting a power semiconductor element on the module base and sealing the power semiconductor element by a sealing material such that the first uneven portion is exposed. A heat sink base unit having a second uneven portion to be fitted to the first uneven portion is prepared. The module base and the heat sink base unit are integrated by placing the first uneven portion and the second uneven portion to face each other, pressing one of the module base in the power module unit and the heat sink base unit against the other, and fitting the first uneven portion and the second uneven portion together. In the step of preparing a module base and the step of preparing a heat sink base unit, one of the first uneven portion and the second uneven portion has a buffer depression portion left as a space in a state in which the module base and the heat sink base unit are bonded.

A power conversion device according to the present disclosure includes: a main conversion circuit having the above power semiconductor device to convert input power and output the converted power; and a control circuit to output a control signal for controlling the main conversion circuit to the main conversion circuit.

Advantageous Effects of Invention

In the power semiconductor device according to the present disclosure, the module base and the heat sink base unit are formed such that one of the first uneven portion and the second uneven portion has a buffer depression portion left as a space in a state in which the module base and the heat sink base unit are bonded to each other. This configuration can reduce the load when the module base and the heat sink base unit are integrated. As a result, a power semiconductor device with improved productivity can be obtained.

In the method of manufacturing a power semiconductor device according to the present disclosure, in the step of preparing a module base and the step of preparing a heat sink base unit, one of the first uneven portion and the second uneven portion has a buffer depression portion left as a space in a state in which the module base and the heat sink base unit are bonded to each other. This configuration can reduce the load when the module base and the heat sink base unit are integrated. As a result, the productivity of the power semiconductor device can be improved.

The power conversion device according to the present disclosure includes the above power semiconductor device and therefore can be improved in productivity.

DESCRIPTION OF EMBODIMENTS

First Embodiment

Figure 1:
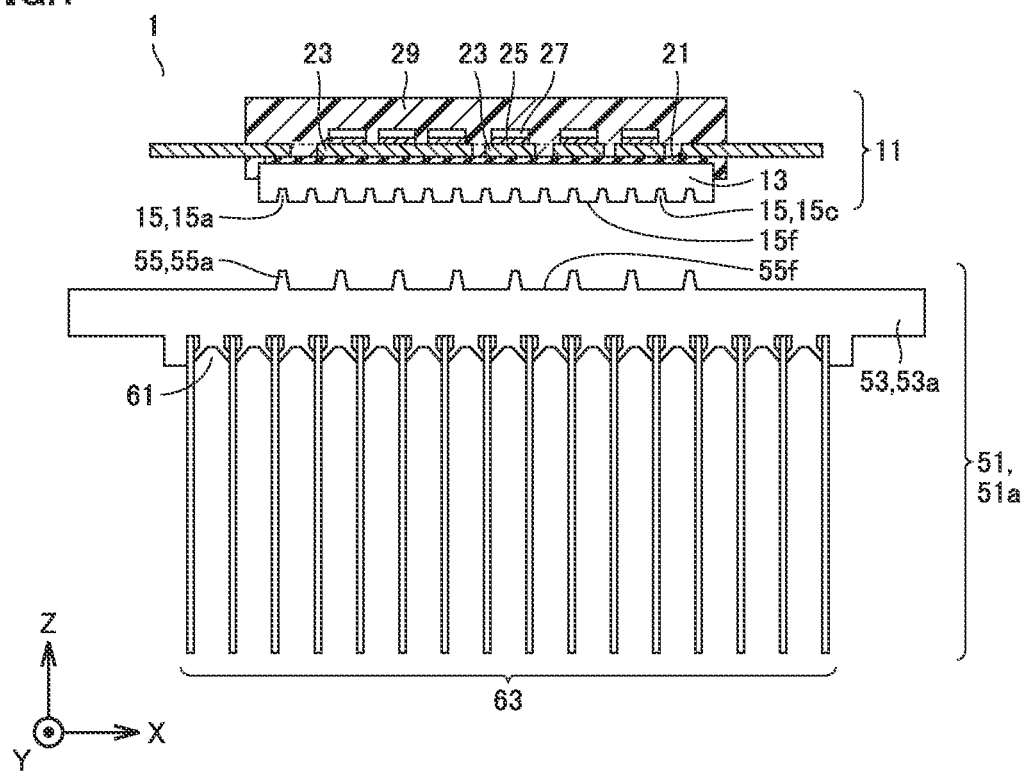
FIG. 1 is an exploded side view including a partial cross section of a power semiconductor device according to a first embodiment.

A power semiconductor device according to a first embodiment will be described. FIG. 1 is an exploded side view including a partial cross section of the power semiconductor device. As illustrated in FIG. 1, power semiconductor device 1 includes a power module unit 11 and a heat sink 51. Power module unit 11 has an uneven portion 15 as a first uneven portion. Heat sink 51 has an uneven portion 55 as a second uneven portion.

Power module unit 11 includes a module base 13. A lead frame 23 is disposed on one surface of module base 13 with an insulating sheet 21 interposed. A chip 27 is bonded to lead frame 23 by solder 25. A power semiconductor element is formed on chip 27. Chip 27 and the like are sealed by a mold resin 29 serving as a sealing material. A part of lead frame 23 protrudes as an external terminal from a side surface of mold resin 29.

Uneven portion 15 is formed on the other surface of module base 13. Uneven portion 15 is formed in an uneven shape such that depression portions 15a and the like are formed in a flat portion 15f. Uneven portion 15 includes depression portions 15a and buffer depression portions 15c. In other words, in this case, module base 13 is formed such that uneven portion 15 has buffer depression portions 15c. Buffer depression portions 15c will be described later.

Figure 2:
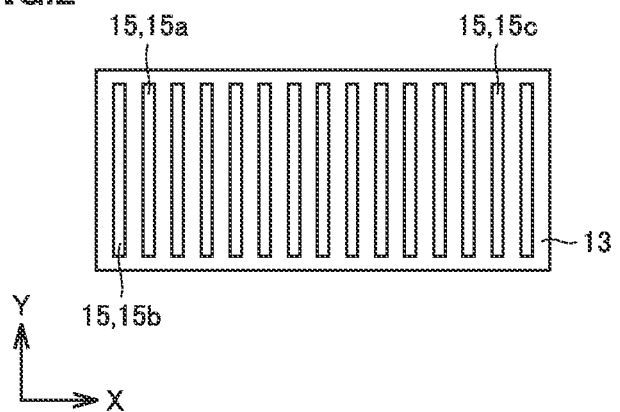
FIG. 2 is a bottom view illustrating an exemplary pattern of an uneven portion formed in a module base in a power module unit of the power semiconductor device illustrated in FIG. 1 in the first embodiment.

As illustrated in FIG. 2, depression portions 15a and the like each extend, for example, along a Y-axis direction as a first direction and are spaced apart from each other in an X-axis direction intersecting the Y-axis direction. Uneven portion 15 means the shape of the entire surface of module base 13 including depression portions 15a and buffer depression portions 15c.

Heat sink 51 includes a heat sink base unit 53 including a heat dissipation spreader 53a, and radiating fins 63. Here, a heat sink 51a having a crimped structure in which radiating fins 63 and heat sink base unit 53 are integrated by crimping is employed as heat sink 51. Uneven portion 55 is formed in heat sink base unit 53 (heat dissipation spreader 53a). Uneven portion 55 is formed in an uneven shape such that projection portions 55a are formed in a flat portion 55f.

Radiating fins 63 are each disposed to extend in the Z-axis direction as a second direction on a side opposite to the side having uneven portion 55 in heat sink base unit 53 and are spaced apart from each other in the X-axis direction as a third direction.

Figure 3:
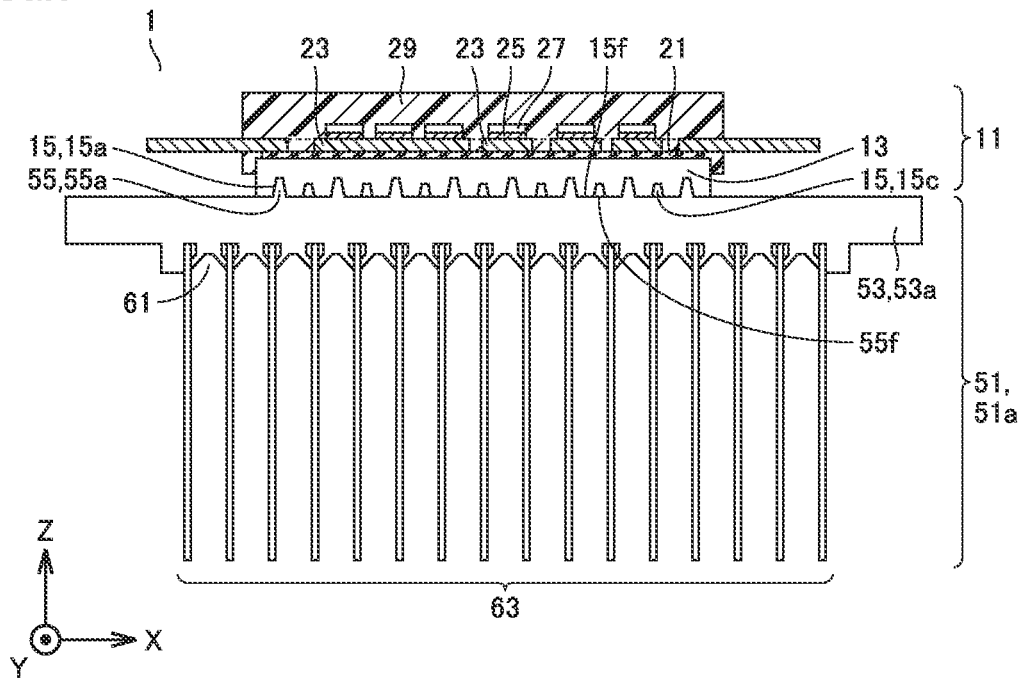
FIG. 3 is a side view including a partial cross section in a state in which the power module unit and a heat sink are integrated in the first embodiment.

As illustrated in FIG. 3, in power semiconductor device 1, uneven portion 15 formed in power module unit 11 and uneven portion 55 formed in heat sink 51 are fitted together by crimping, whereby power module unit 11 and heat sink 51 are bonded and integrated. Here, projection portion 55a is not fitted in buffer depression portion 15c. Specifically, in a state in which module base 13 and heat sink base unit 53 are fitted together, uneven portion 15 has buffer depression portion 15c in which a depression portion is left as a space. One buffer depression portion 15c is disposed between one depression portion 15a and another depression portion 15a adjacent to each other when uneven portion 15 and uneven portion 55 are fitted together. However, two or more buffer depression portions 15c may be disposed therebetween.

Module base 13 is fabricated, for example, by cutting, die casting, casting, or extruding. Module base 13 is formed of, for example, aluminum or aluminum alloy. Heat sink base unit 53 is fabricated, for example, by cutting, die casting, casting, or extruding. Heat sink base unit 53 is formed of, for example, aluminum or aluminum alloy. Power semiconductor device 1 according to the first embodiment is configured as described above.

An exemplary method of manufacturing power semiconductor device 1 described above will now be described. First, module base 13 having uneven portion 15 including depression portions 15a and buffer depression portions 15c is prepared (see FIG. 4). Chip 27 with a power semiconductor element is mounted on module base 13 and sealed by mold resin 29 to form power module unit 11 (see FIG. 4). Further, heat sink 51a (51) having uneven portion 55 and crimp portions 61 is prepared (see FIG. 4). In addition, a plurality of plate-shaped radiating fins 63 are prepared (see FIG. 4).

Figure 4:
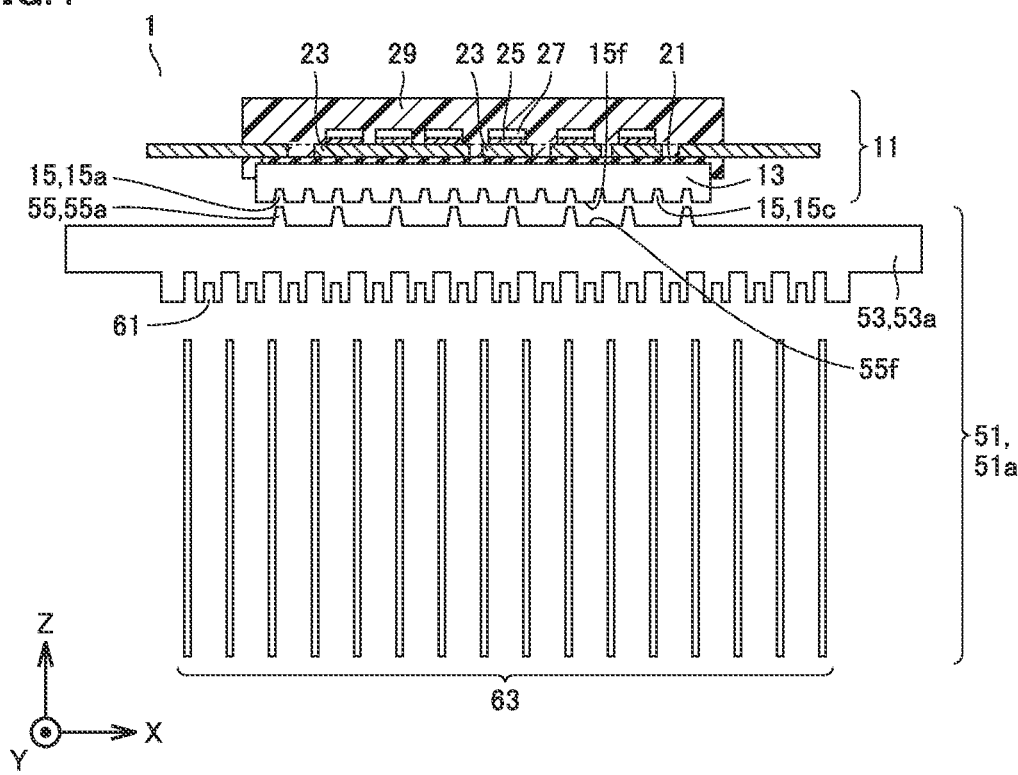
FIG. 4 is a side view including a partial cross section illustrating a step of a method of manufacturing a power semiconductor device in the first embodiment.

Next, as illustrated in FIG. 4, power module unit 11 and heat sink base unit 53 are disposed such that uneven portion 15 formed on module base 13 of power module unit 11 and uneven portion 55 formed on heat sink base unit 53 face each other. Further, a plurality of radiating fins 63 are disposed at positions facing crimp portions 61 formed in heat sink base unit 53.

Figure 5:
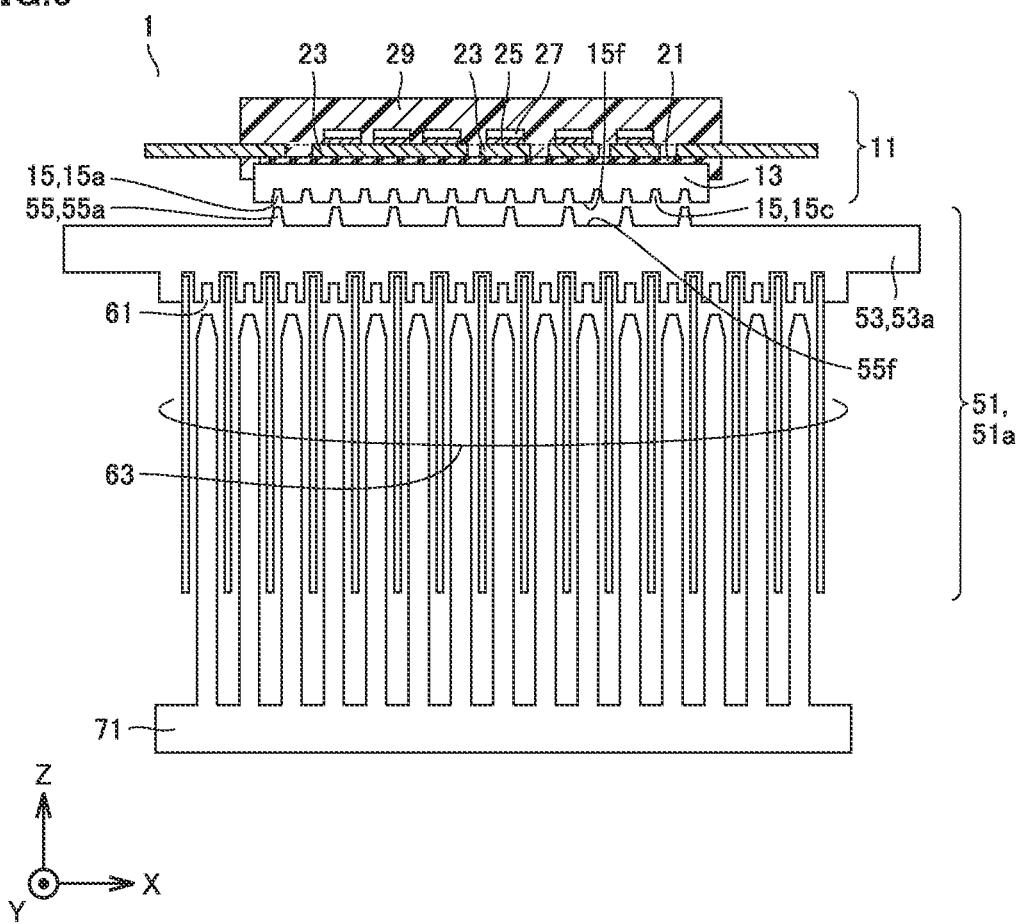
FIG. 5 is a side view including a partial cross section illustrating a step performed after the step illustrated in FIG. 4 in the first embodiment.

Next, as illustrated in FIG. 5, each of radiating fins 63 is inserted into a corresponding groove (fin insertion groove) located between crimp portion 61 and crimp portion 61 adjacent to each other, and a press blade 71 as a processing tool is inserted toward crimp portions 61.

Figure 6:
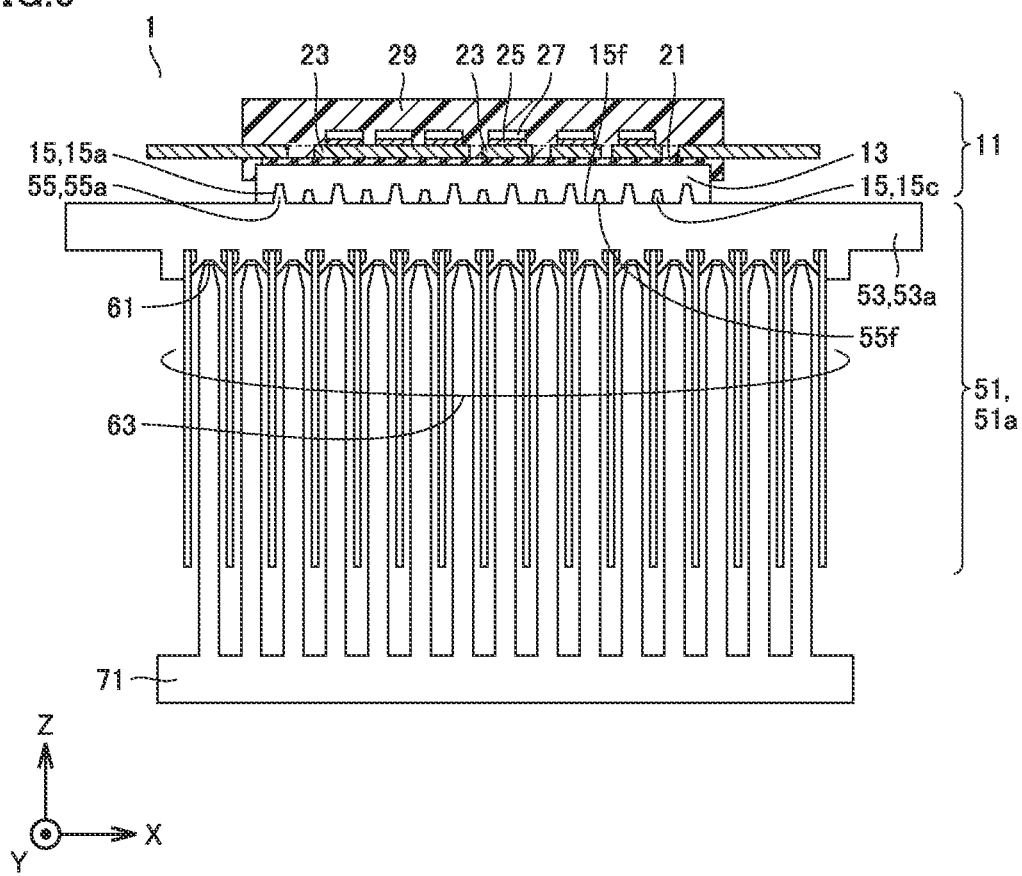
FIG. 6 is a side view including a partial cross section illustrating a step performed after the step illustrated in FIG. 5 in the first embodiment.

Next, as illustrated in FIG. 6, press blade 71 is brought into contact with crimp portions 61. In this state, power module unit 11 is pressed from above, so that uneven portion 15 of module base 13 (power module unit 11) and uneven portion 55 of heat sink base unit 53 are fitted together, and power module unit 11 is bonded to heat sink base unit 53.

Further, crimp portions 61 are crimped by press blade 71, so that a plurality of radiating fins 63 are bonded to heat sink base unit 53. Subsequently, press blade 71 is removed, resulting in power semiconductor device 1 in which power module unit 11 and heat sink 51 are integrated as illustrated FIG. 3.

In power semiconductor device 1 described above, module base 13 has buffer depression portions 15c in which projection portions 55a in uneven portion 55 formed in heat sink base unit 53 are not fitted. This configuration can reduce load when module base 13 is bonded to heat sink base unit 53. This will be described using a schematic diagram.

Figure 7:
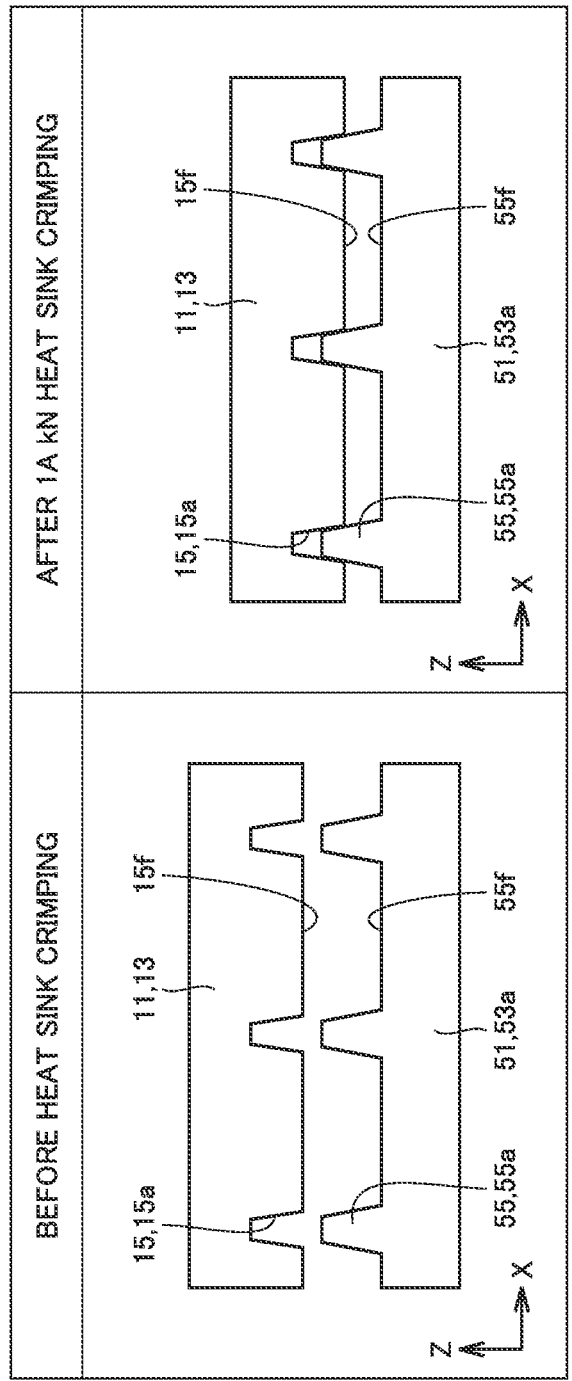
FIG. 7 is a first diagram for explaining the operation effect of the power semiconductor device in the first embodiment.

First, FIG. 7 schematically illustrates a state before module base 13 and heat sink base unit 53 are fitted (before heat sink crimping) and a state after they are fitted (after heat sink crimping) in a case of module base 13 with no buffer depression portions as a comparison.

Figure 8:
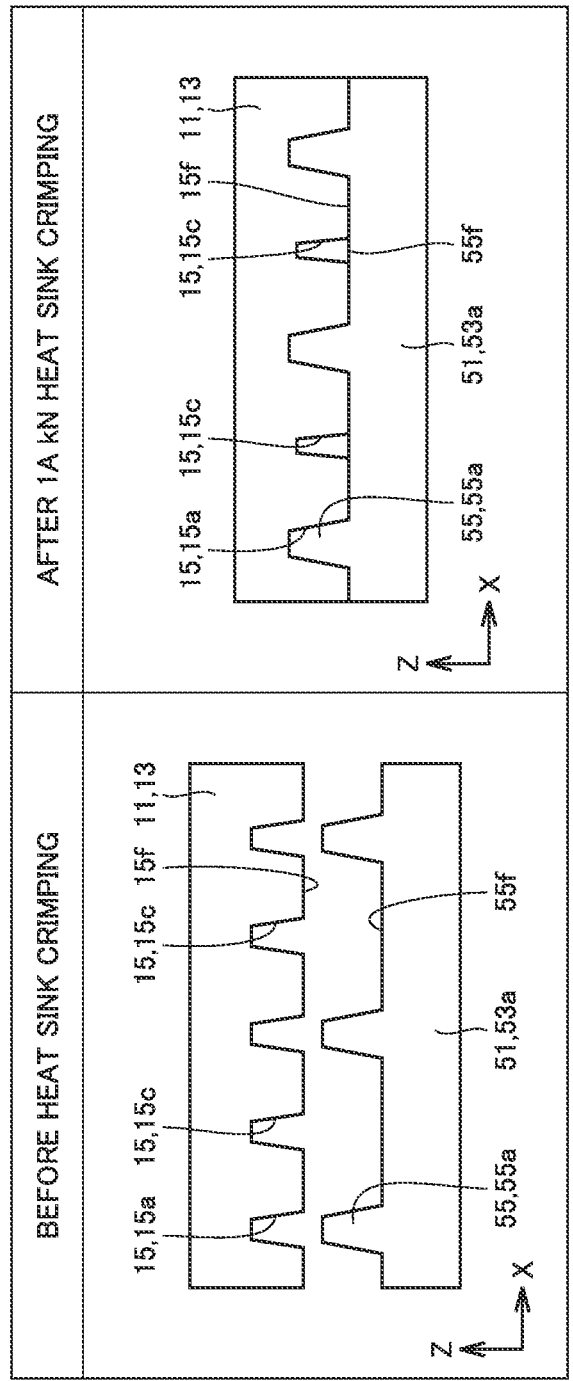
FIG. 8 is a second diagram for explaining the operation effect of the power semiconductor device in the first embodiment.

On the other hand, FIG. 8 schematically illustrates a state before module base 13 and heat sink base unit 53 are fitted (before heat sink crimping) and a state after they are fitted (after heat sink crimping) in a case of module base 13 with buffer depression portions 15c according to the first embodiment. In both cases, when module base 13 and heat sink base unit 53 are fitted, a load serving as a reference is applied as a press load. This load serving as a reference is referred to as "1 A kN".

As illustrated in FIG. 7, in module base 13 with no buffer depression portions, even when a reference load of 1 A kN is applied, there is a distance between flat portion 15f in module base 13 and flat portion 55f in heat sink base unit 53, and heat sink crimping is not completed. As used herein "heat sink crimping is completed" refers to a state in which the gap between module base 13 and heat sink base unit 53 is not changed even by increasing the press load.

On the other hand, as illustrated in FIG. 8, in module base 13 with buffer depression portions 15c, when a reference load of 1 A kN is applied, the portion of module base 13 that is located around buffer depression portion 15c is plastically deformed. Thus, flat portion 15f in module base 13 and flat portion 55f in heat sink base unit 53 come into contact with each other, and the gap between module base 13 and heat sink base unit 53 is not changed even by increasing the press load, thereby completing heat sink crimping.

In this way, in power semiconductor device 1 according to the first embodiment, the provision of buffer depression portions 15c in module base 13 can reduce the press load applied to complete heat sink crimping.

Since the portion of module base 13 that is located around buffer depression portion 15c is plastically deformed, the tolerance range for relative displacement between module base 13 and heat sink base unit 53 (heat sink 51) is increased, compared with when buffer depression portions 15c are not provided.

As a result, the accuracy in positioning of module base 13 and heat sink base unit 53 (heat sink 51) can be relaxed in heat sink crimping, and a more simple positioning jig can be used as a positioning jig. Accordingly, heat sink crimping with higher productivity can be realized, compared with a power semiconductor device in which the uneven portion formed in the module base and the uneven portion formed in the heat sink are fitted together and thereby integrated as disclosed in PTL 9 and PTL 10.

Figure 9:
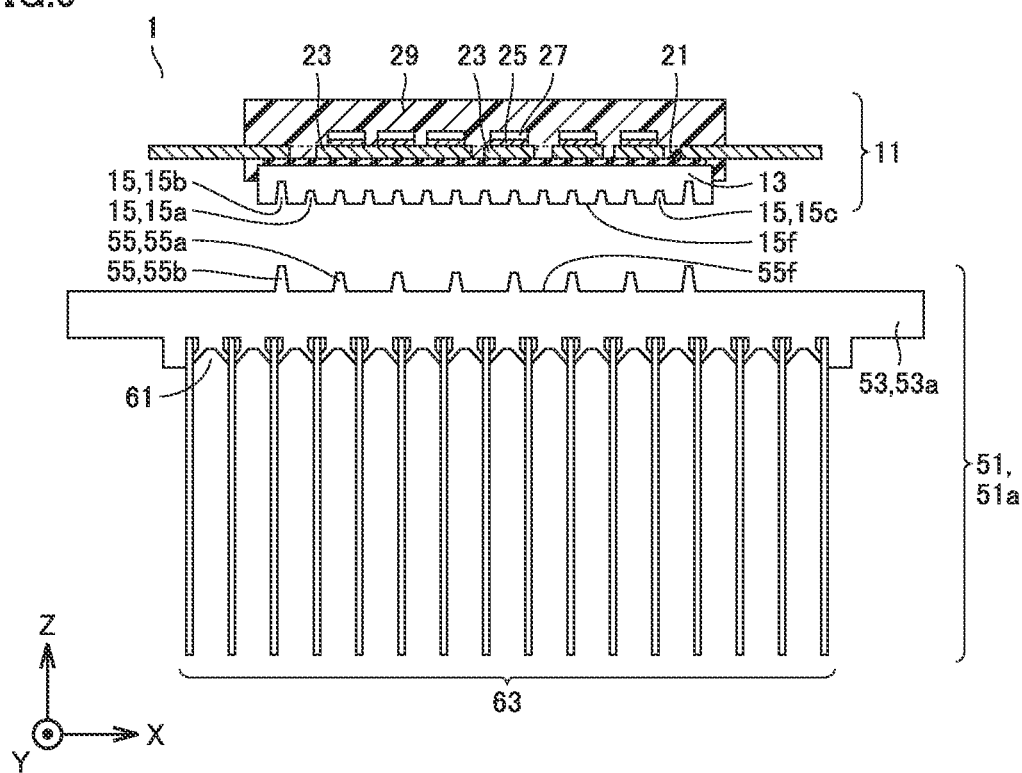
FIG. 9 is an exploded side view including a partial cross section illustrating a first modification of a structure of the uneven portion in the first embodiment.

Further, in view of (relaxing) the positioning accuracy, as illustrated in FIG. 9, depression portions 15b deeper than depression portions 15a may be provided as uneven portion 15, and projection portions 55b higher than projection portions 55a may be provided as uneven portion 55.

The provision of such deeper depression portions 15b and higher projection portions 55b enables rough alignment of module base 13 with heat sink base unit 53 (heat sink 51) when module base 13 and heat sink base unit 53 (heat sink 51) are aligned.

With a load applied in this state, higher projection portion 55b slides on the inclined portion of deeper depression portion 15b, and heat sink crimping is started. In this case, the positioning accuracy in the X-axis direction can be further relaxed, and an even simpler positioning jig can be used as a positioning jig. As a result, heat sink crimping with even higher productivity can be realized.

It is preferable that deeper depression portions 15b are disposed at an end in the X-axis direction (positive direction) and an end in the X-axis direction (negative direction) in module base 13, and that higher projection portions 55b are disposed at an end in the X-axis direction (positive direction) and an end in the X-axis direction (negative direction) in heat sink base unit 53. This configuration facilitates rough alignment of module base 13 with heat sink base unit 53 (heat sink 51) and contributes to improvement in productivity of heat sink crimping.

The inventors of the present invention performed an evaluation of the effect of buffer depression portions 15c by plastic working analysis (simulation). This evaluation will be described.

Figure 10:
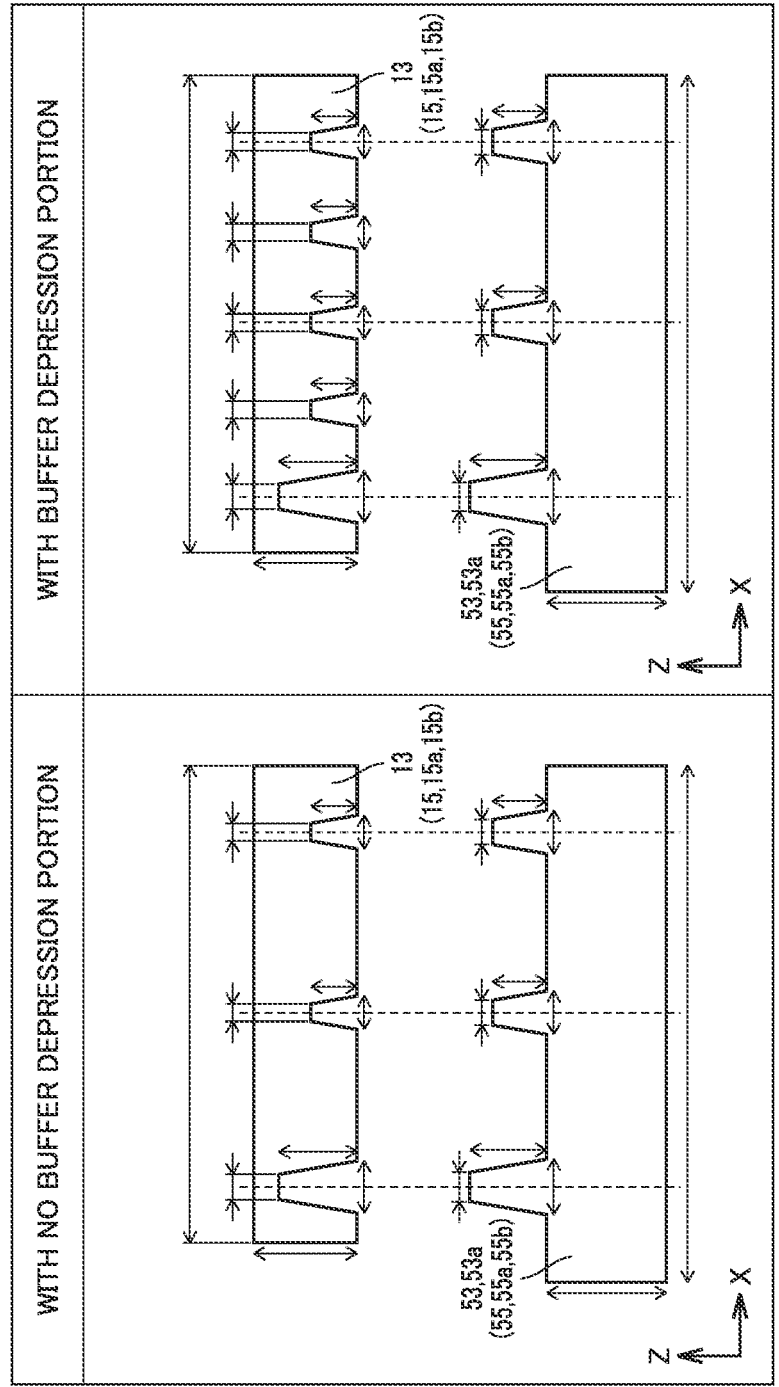
FIG. 10 is a third diagram for explaining the operation effect of the power semiconductor device in the first embodiment.

FIG. 10 illustrates models used for analysis, namely, a model (comparative example) in which buffer depression portions are not formed and a model (embodiment) in which buffer depression portions are formed. The dimensions of each section of module base 13 and heat sink base unit 53 were set such that a short section (see a short dimension line) was set to approximately a few mm and a long section (see a long dimension line) was set to approximately a few tens mm. The position on the center line in the X-axis direction of projection portion 55a (see the dotted line) was matched with the position on the center line in the X-axis direction of depression portion 15a and the like (see the dotted line).

Pure aluminum A1050 was set as the material of module base 13. Aluminum-magnesium-silicon alloy A6063 was set as the material of heat sink base unit 53. Using this model, how module base 13 and the like were plastically deformed depending on the presence/absence of buffer depression portions was analyzed.

Figure 11:
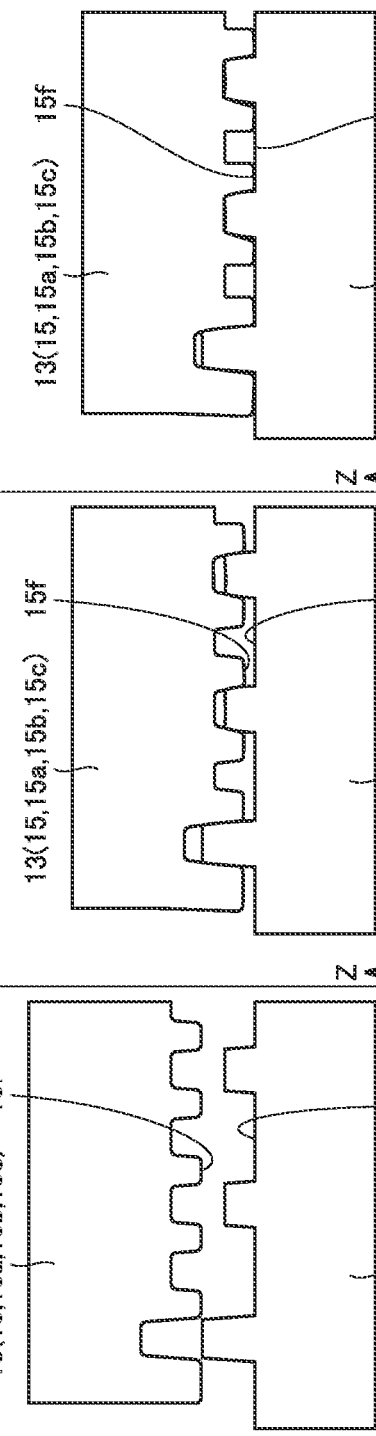
FIG. 11 is a fourth diagram for explaining the operation effect of the power semiconductor device in the first embodiment.
Figure 12:
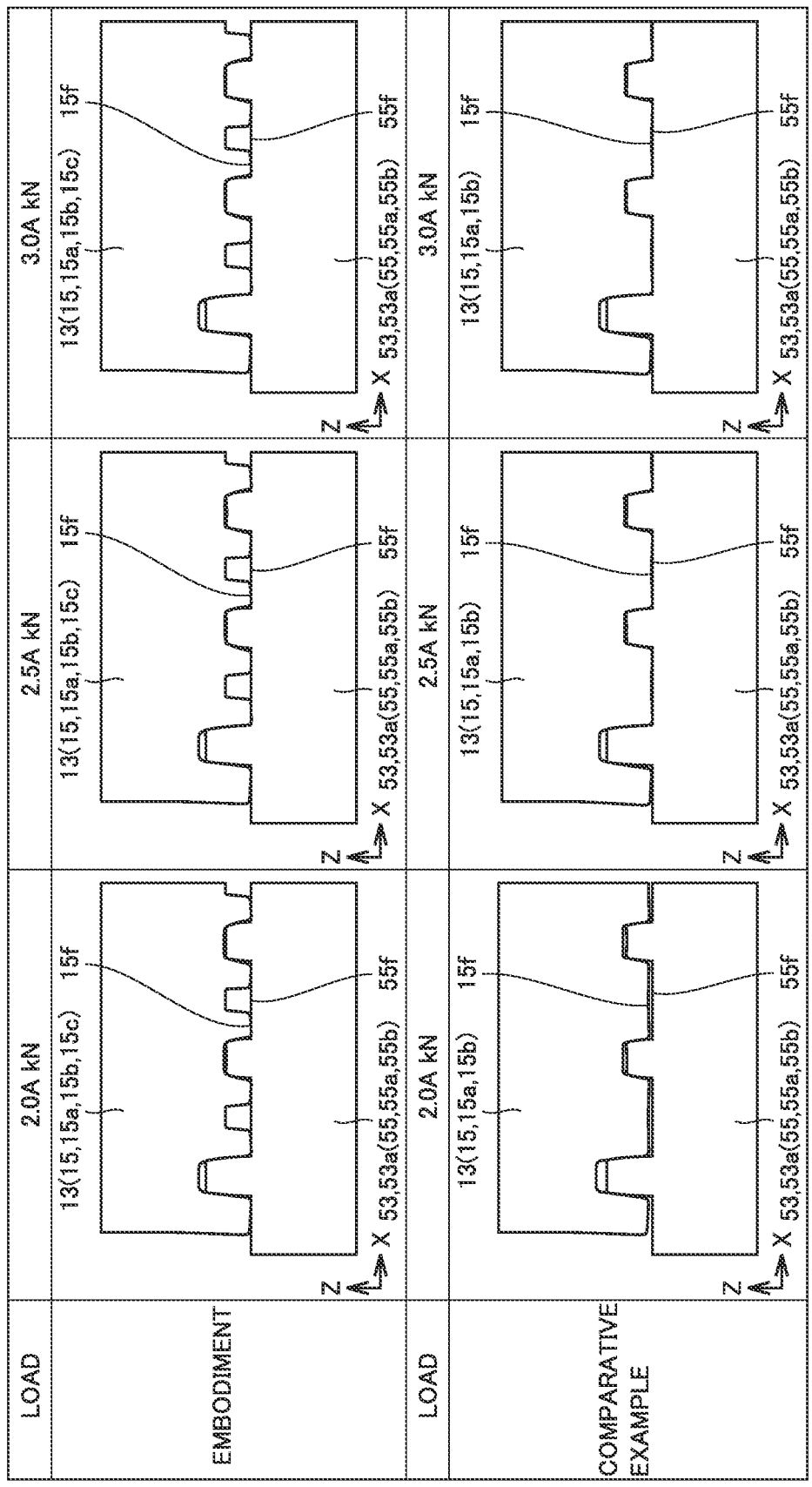
FIG. 12 is a fifth diagram for explaining the operation effect of the power semiconductor device in the first embodiment.

The results are illustrated in FIG. 11 and FIG. 12. In FIG. 11 and FIG. 12, the model (model A) having the buffer depression portions according to the first embodiment is illustrated in the upper section, and the model (model B) having no buffer depression portions according to the comparative example is illustrated in the lower section. In the analysis, the analysis was performed with a grid set in each of module base 13 and heat sink base unit 53, but in FIG. 11 and FIG. 12, only the profile of each is illustrated and the grid is not illustrated in order to avoid complication of the drawings.

In FIG. 11, for each of model A and model B, a state before heat sink crimping, a state with a reference load (1 A kN) applied, and a state with a load (1.5 A kN) 1.5 times higher than the reference load applied are illustrated.

In FIG. 12, for each of model A and model B, a state with a load (2.0 A kN) 2.0 times higher than the reference load applied, a state with a load (2.5 A kN) 2.5 times higher than the reference load applied, and a state with a load (3.0 A kN) 3.0 times higher than the reference load applied are illustrated.

As illustrated in FIG. 11 and FIG. 12, in both of model A and model B, as the press load increases, projection portion 55a is fitted into depression portion 15a, and the gap between flat portion 15f of module base 13 and flat portion 55f of heat sink base unit 53 is gradually narrowed.

Figure 13:
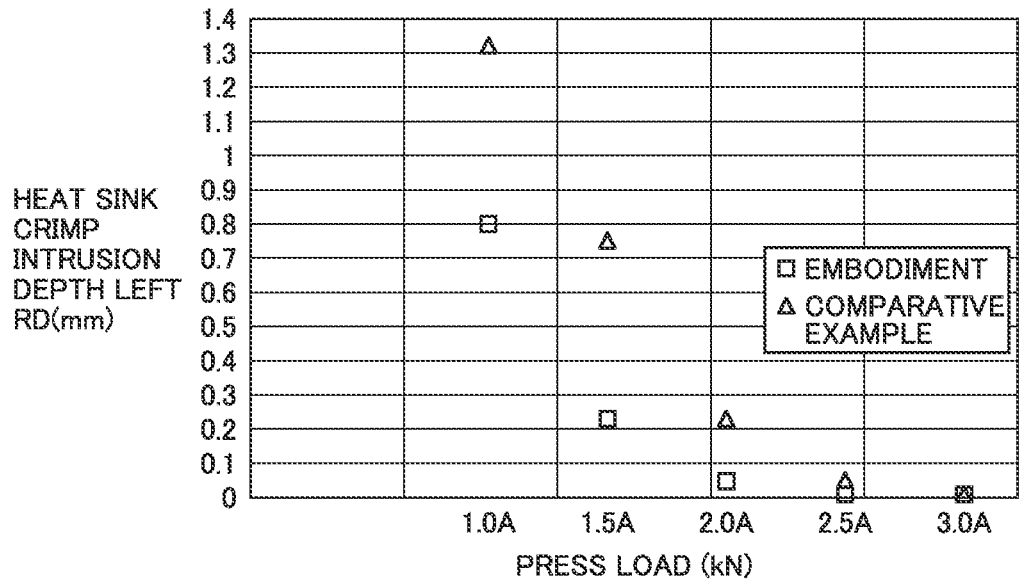
FIG. 13 is a sixth diagram for explaining the operation effect of the power semiconductor device in the first embodiment.
Figure 14:
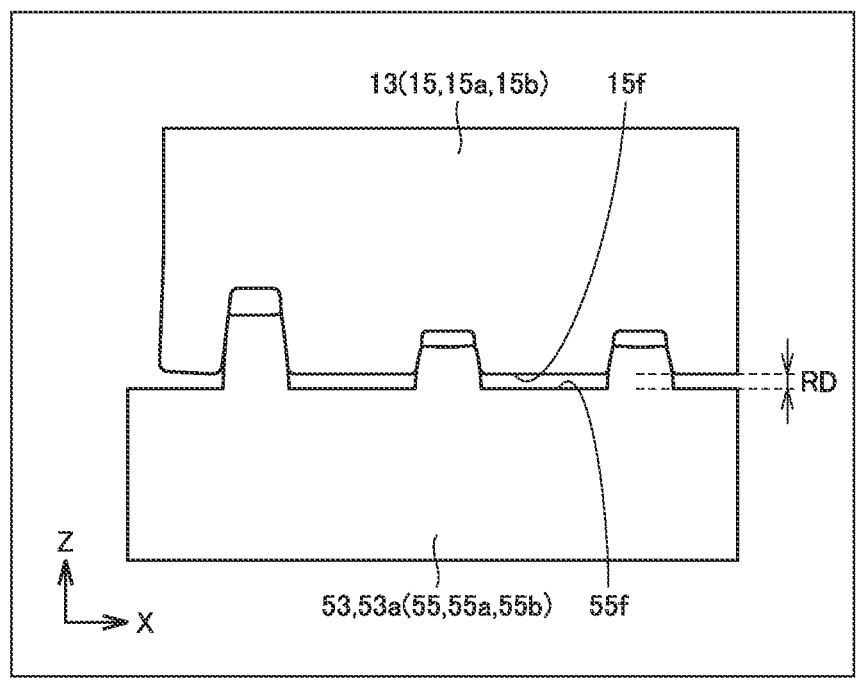
FIG. 14 is a seventh diagram for explaining the operation effect of the power semiconductor device in the first embodiment.

Next, the relation between the press load and the gap was determined based on the evaluation results illustrated in FIG. 11 and FIG. 12. The results are illustrated in FIG. 13. The horizontal axis represents the press load. The vertical axis represents gap RD. As illustrated in FIG. 14, gap RD is the distance between flat portion 15f of module base 13 and flat portion 55f of heat sink base unit 53. This distance can be considered as the distance left before the projection portion of module base 13 is fitted into the depression portion of the heat sink base unit.

Here, it is assumed that heat sink crimping is completed when the value of gap RD becomes equal to or smaller than 0.05 mm. Then, it has been found that the press load required to complete heat sink crimping is 2.5 A kN in model B (comparative example) whereas it is 2.0 A kN in model A (first embodiment). Therefore, it has been revealed that in model A (first embodiment) compared with model B (comparative example), the press load required to complete heat sink crimping can be reduced by 20%.

The above evaluation results are only an example, and the press load can be further reduced by designing a structure including buffer depression portions 15c in module base 13 and heat sink base unit 53.

Figure 15:
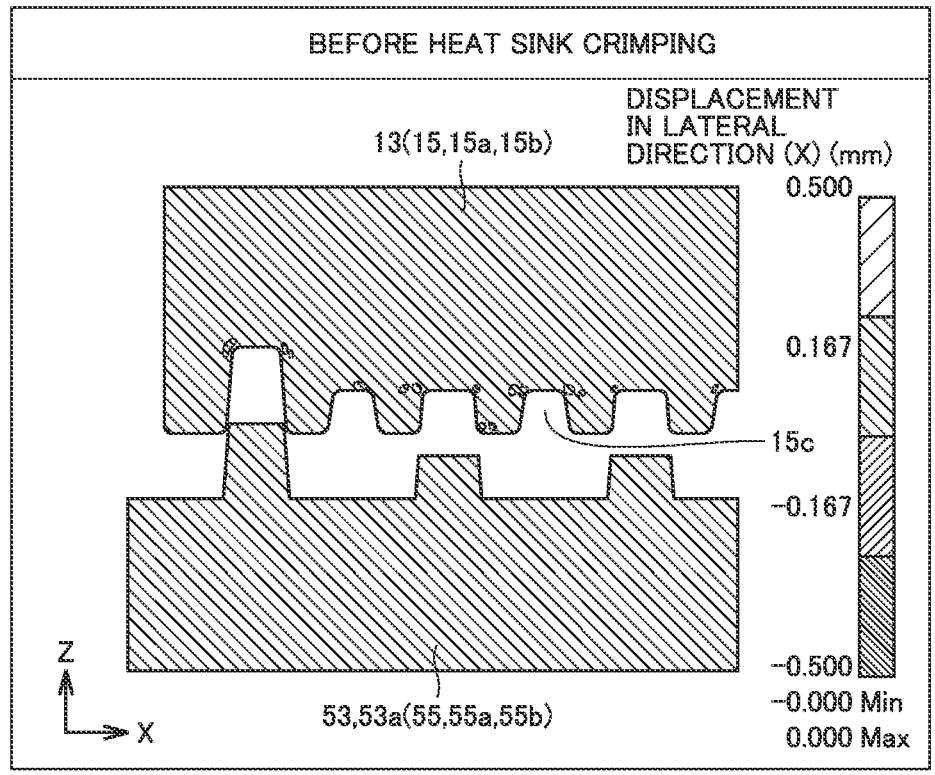
FIG. 15 is an eighth diagram for explaining the operation effect of the power semiconductor device in the first embodiment.
Figure 16:
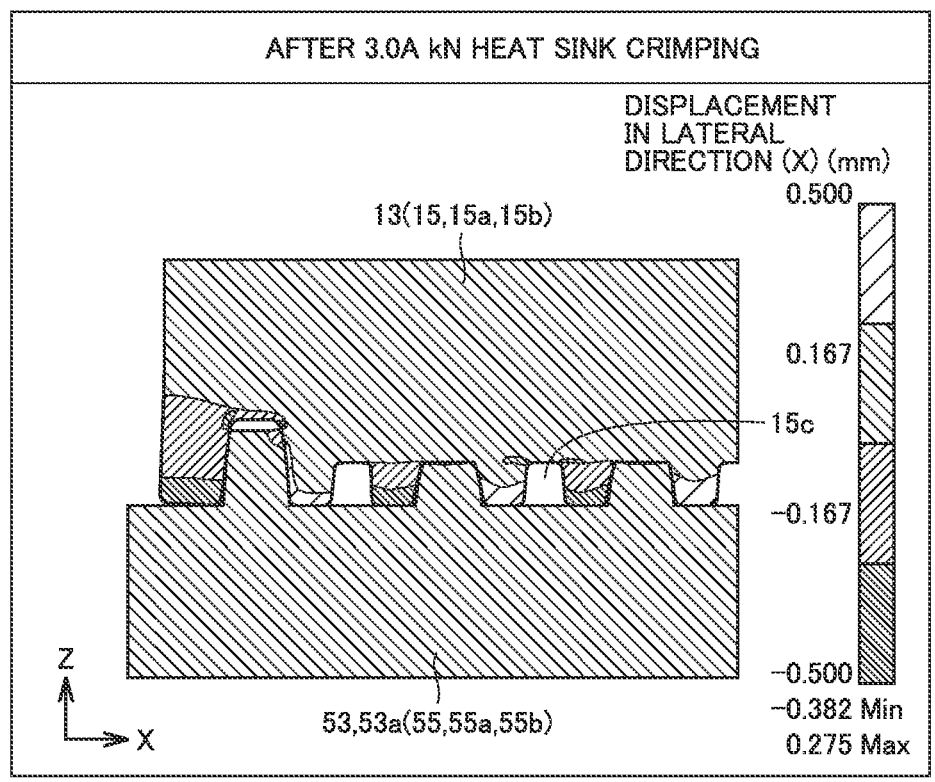
FIG. 16 is a ninth diagram for explaining the operation effect of the power semiconductor device in the first embodiment.

The reduction of the press load is presumably attributable to that module base 13 and the like are plastically deformed because of buffer depression portions 15c. The inventors evaluated the amount of plastic deformation. FIG. 15 illustrates a state before heat sink crimping. FIG. 16 illustrates isolines (contour figure) of the amount of plastic deformation (X-axis direction) in a state in which a press load (3.0 A kN) 3.0 times higher than the reference press load is applied.

As illustrated in FIG. 15 and FIG. 16, it has been found that module base 13 is plastically deformed approximately ±0.2 mm in the X-axis direction by applying a press load (3.0 A kN) from the state before heat sink crimping. This evaluation has demonstrated that the plastic deformation of module base 13 caused by the formation of buffer depression portion 15c contributes to the reduction of the press load.

The retention strength between module base 13 and heat sink base unit 53 after heat sink crimping can be adjusted by increasing or decreasing the region (area) provided with buffer depression portions 15c in which projection portions 55a are not fitted. The retention strength in this case is a vertical tensile strength and refers to the maximum strength immediately before module base 13 and heat sink base unit 53 are pulled apart from each other in tensile testing of module base 13 and heat sink base unit 53. When the retention strength between module base 13 and heat sink base unit 53 is required, the region (area) of buffer depression portions 15c is adjusted to such a degree that the effect of reducing the press load is achieved.

(Variations of Buffer Depression Portion)

Figure 17:
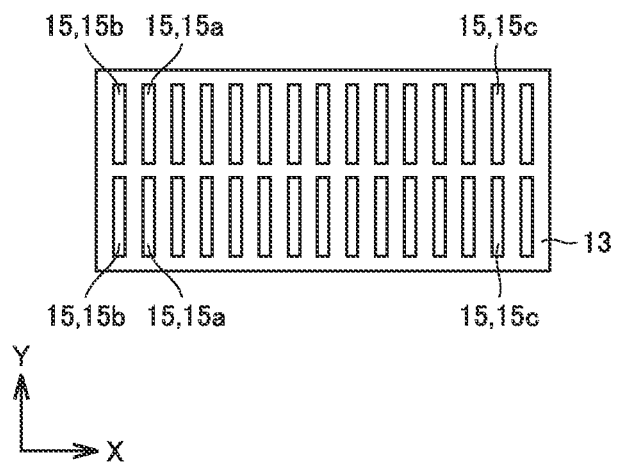
FIG. 17 is a bottom view illustrating another exemplary pattern of the uneven portion formed in the module base in the power module unit in the first embodiment.

Buffer depression portion 15c in module base 13 in power semiconductor device 1 is formed uniformly along the Y-axis direction, as an example (see FIG. 2). However, buffer depression portion 15c is not limited to this example. As illustrated in FIG. 17, buffer depression portion 15c may be formed in a discontinuous manner along the Y-axis direction. Even in this case, the same effect as when buffer depression portion 15c is formed uniformly can be achieved.

When uneven portion 15 including buffer depression portions 15c is formed in a discontinuous manner, uneven portion 55 formed in heat sink base unit 53 is also formed in a discontinuous manner so as to correspond to uneven portion 15.

In module base 13 in power semiconductor device 1 described above, one buffer depression portion 15c is disposed between adjacent depression portion 15a and depression portion 15a fitted to projection portions 55a, at each location (seven locations), as an example (see FIG. 3).

Figure 18:
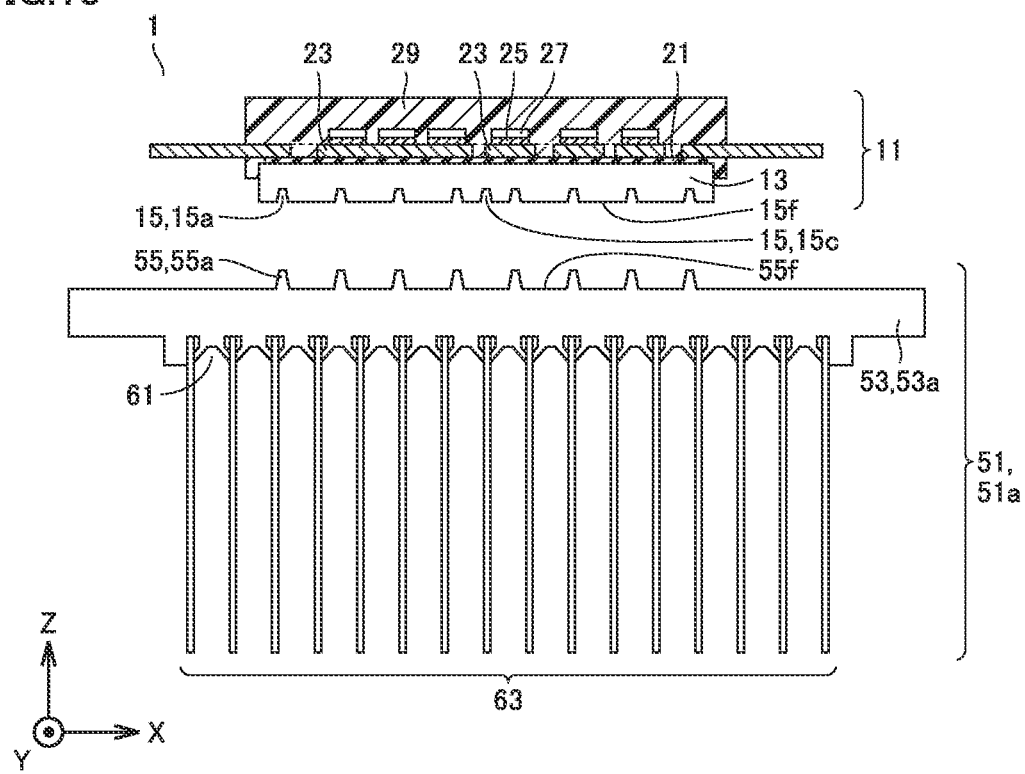
FIG. 18 is an exploded side view including a partial cross section illustrating a second modification of a structure of the uneven portion in the first embodiment.
Figure 19:
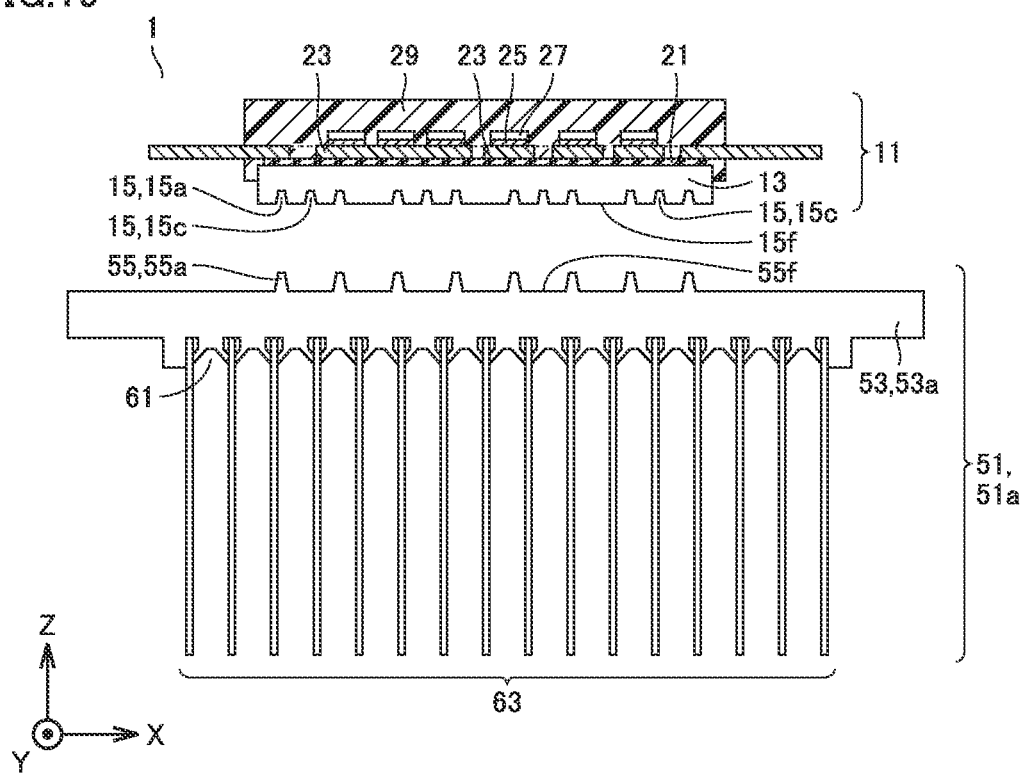
FIG. 19 is an exploded side view including a partial cross section illustrating a third modification of a structure of the uneven portion in the first embodiment.

The manner of arrangement of buffer depression portions 15c is not limited to this example. As illustrated in FIG. 18, a structure of buffer depression portion 15c formed between depression portion 15a and depression portion 15a adjacent to each other may be provided at only one place in module base 13. As illustrated in FIG. 19, a structure of buffer depression portion 15c formed between depression portion 15a and depression portion 15a adjacent to each other may be provided at four places in module base 13. Such manners of arrangement of buffer depression portion 15c can also contribute to reduction of the press load.

Further, in power semiconductor device 1 described above, a structure of buffer depression portion 15c is formed in module base 13, as an example. However, the buffer depression portion may be formed in heat sink base unit 53.

Figure 20:
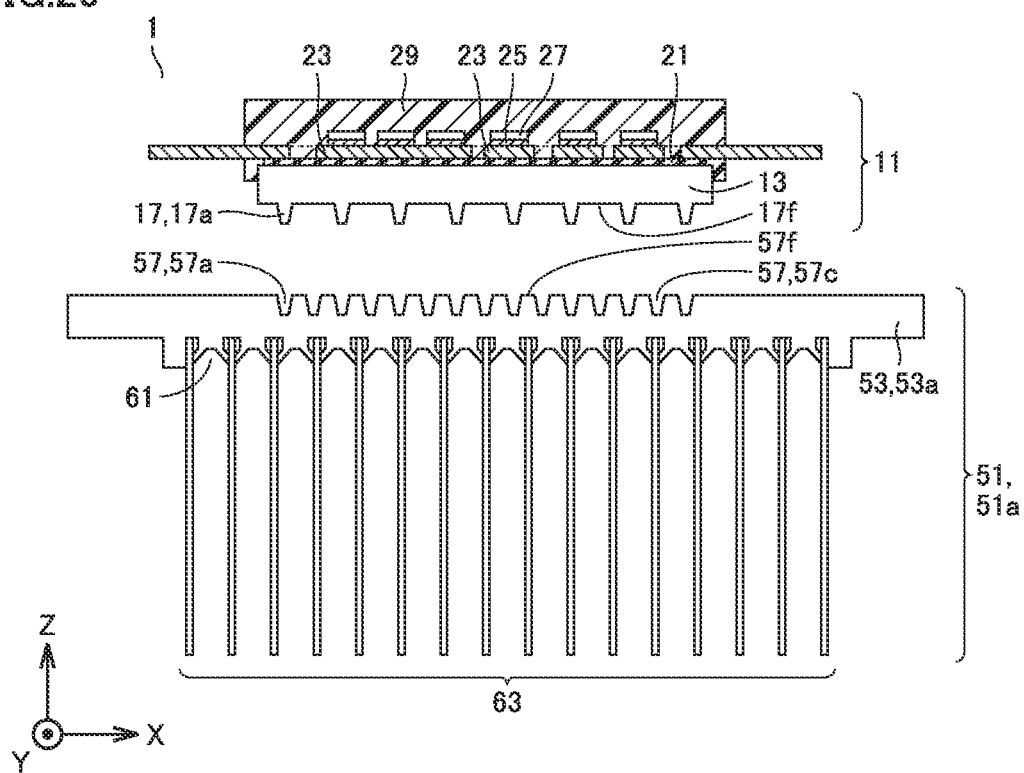
FIG. 20 is an exploded side view including a partial cross section illustrating a fourth modification of a structure of the uneven portion in the first embodiment.

As illustrated in FIG. 20, in power semiconductor device 1, an uneven portion 17 is formed in module base 13. Uneven portion 17 is formed in an uneven shape such that projection portions 17a are formed in a flat portion 17f. An uneven portion 57 is formed in heat sink base unit 53 (heat dissipation spreader 53a). Uneven portion 57 includes depression portions 57a and buffer depression portions 57c.

Projection portion 17a is not fitted in buffer depression portion 57c. Uneven portion 57 is formed in an uneven shape such that depression portions 57a and buffer depression portions 57c are formed in a flat portion 57f. In other words, in this case, heat sink base unit 53 is formed such that uneven portion 57 has buffer depression portions 57c.

Since uneven portion 57 formed in heat sink base unit 53 includes buffer depression portions 57c that are not fitted to projection portions 17a of uneven portion 17 formed in module base 13, the press load can be reduced to contribute to improvement in productivity, in the same manner as in power semiconductor device 1 illustrated in FIG. 1 and the like.

(Radiating Fin)

Radiating fin 63 of heat sink 51 is a plate member (rolled member) formed of, for example, aluminum or aluminum alloy. With such a plate member, both of workability and heat dissipation can be achieved.

Further, radiating fin 63 may be embossed so that minute depressions are formed in a surface of radiating fin 63. The formation of depressions in a surface of radiating fin 63 can increase the heat dissipating surface area of radiating fin 63 and improve the heat dissipation performance. Embossing can be applied by a die used to produce radiating fin 63 by press work. The surface of radiating fin 63 thus can be embossed without increasing the production cost.

Further, when the embossed radiating fins 63 are stacked, the contact area between radiating fin 63 and radiating fin 63 adjacent to each other can be reduced and the surface friction between radiating fins 63 can be reduced. Thus, the production facility used for crimping to integrate heat sink base unit 53 and radiating fin 63 can be simplified. In addition, the takt time can be reduced and the productivity can be improved.

In the embossed radiating fin 63, when radiating fin 63 is crimped in heat sink base unit 53, crimp portion 61 bites into the embossed depressions to bring about an anchor effect. This configuration can increase the friction force in a direction in which radiating fin 63 is pulled out of the crimp portion, and can enhance the vertical tensile strength of radiating fin 63 relative to heat sink base unit 53.

Here, if the hardness of radiating fin 63 is higher (harder) than the hardness of heat sink base unit 53, crimp portion 61 of heat sink base unit 53 is plastically deformed to conform to the surface of the embossed radiating fin 63, rather than biting into radiating fin 63. Thus, the vertical tensile strength of the embossed radiating fin relative to heat sink base unit 53 can be improved.

On the other hand, if the hardness of heat sink base unit 53 (crimp portion 61) is higher (harder) than the hardness of radiating fin 63, crimp portion 61 bites into the surface of radiating fin 63, so that radiating fin 63 is plastically deformed. In this case, the plastic deformation of radiating fin 63, rather than the effect by embossing, can improve the vertical tensile strength relative to heat sink base unit 53.

Based on these findings, it is preferable that the vertical tensile strength of radiating fin 63 relative to heat sink base unit 53 is improved by employing at least one of the method of embossing the surface of radiating fin 63 and the method of making the hardness of heat sink base unit 53 (crimp portion 61) higher (harder) than the hardness of radiating fin 63.

The inventors of the present invention fabricated a sample (sample A) by forming heat sink base unit 53 from an aluminum 6000 series material of aluminum-magnesium-silicon alloy and forming radiating fins 63 from an aluminum 1000 series material of pure aluminum, and evaluated the vertical tensile strength. As a comparative example, a sample (sample B) was fabricated by forming both of heat sink base unit 53 and radiating fins 63 from an aluminum 1000 series material of pure aluminum, and the vertical tensile strength was evaluated. The results have indicated that the vertical tensile strength of sample A is approximately 2.5 to 3.6 times higher than the vertical tensile strength of sample B.

In power semiconductor device 1, the materials of module base 13, heat sink base unit 53, and radiating fins 63 are not limited to an aluminum-based material, and an optimum material is used according to the specifications of power semiconductor device 1. For example, in view of the heat dissipation ability, for example, a copper-based plate member having a thermal conductivity higher than an aluminum-based material is employed for radiating fins 36, thereby further improving the heat dissipation performance.

In power semiconductor device 1 described above, heat sink 51a having a crimped structure in which radiating fins 63 and heat sink base unit 53 are integrated by crimping is employed as heat sink 51. In this configuration, radiating fins 63 can be designed and produced according to the specifications, separately from heat sink base unit 53, thereby contributing improvement of the heat dissipation ability of heat sink 51a.

Figure 21:
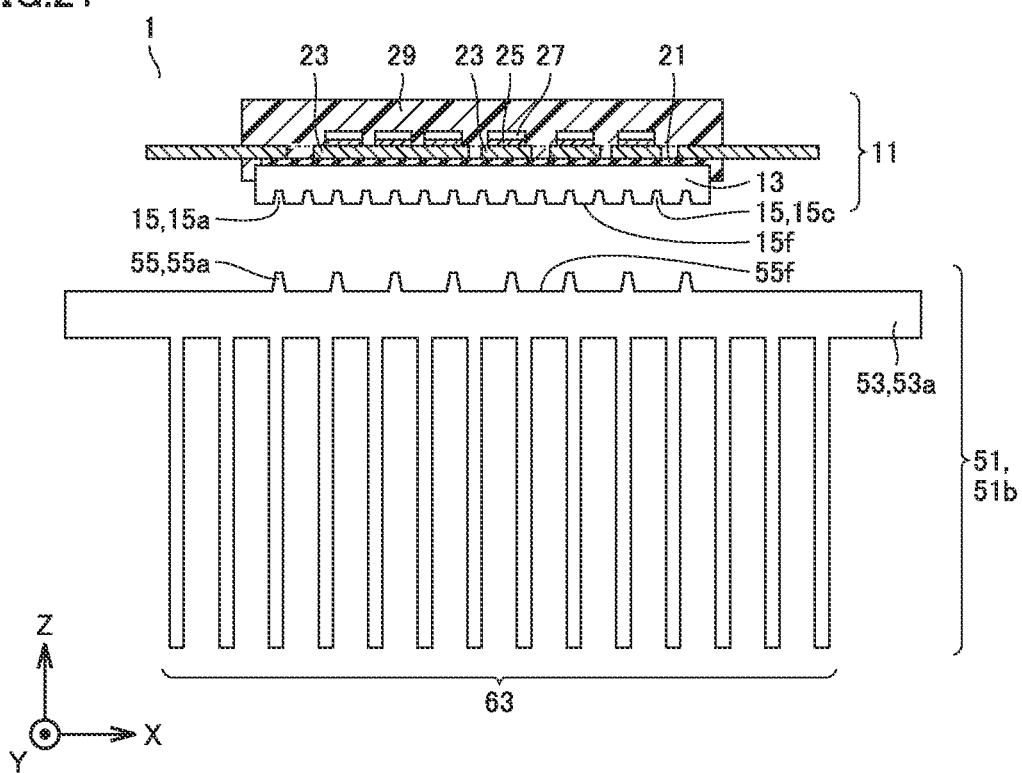
FIG. 21 is an exploded side view including a partial cross section illustrating a first modification of a structure of the heat sink in the first embodiment.
Figure 22:
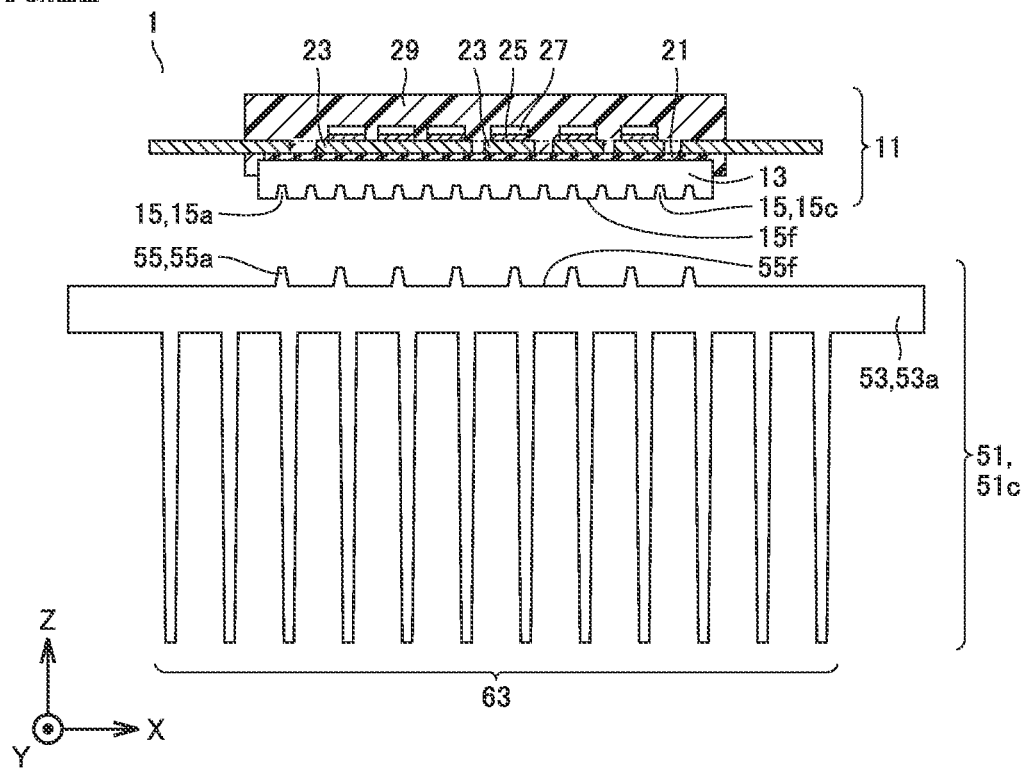
FIG. 22 is an exploded side view including a partial cross section illustrating a second modification of a structure of the heat sink in the first embodiment.

As heat sink 51 of power semiconductor device 1, other than heat sink 51a having a crimped structure, heat sink 51 in which radiating fins 63 and heat sink base unit 53 are integrally formed may be employed. As illustrated in FIG. 21, a heat sink 51b in which heat sink base unit 53 and radiating fins 63 are integrally formed by extruding, machining, or forging may be employed as heat sink 51. As illustrated in FIG. 22, a heat sink 51c in which heat sink base unit 53 and radiating fins 63 are integrally formed by die casting may be employed.

Figure 23:
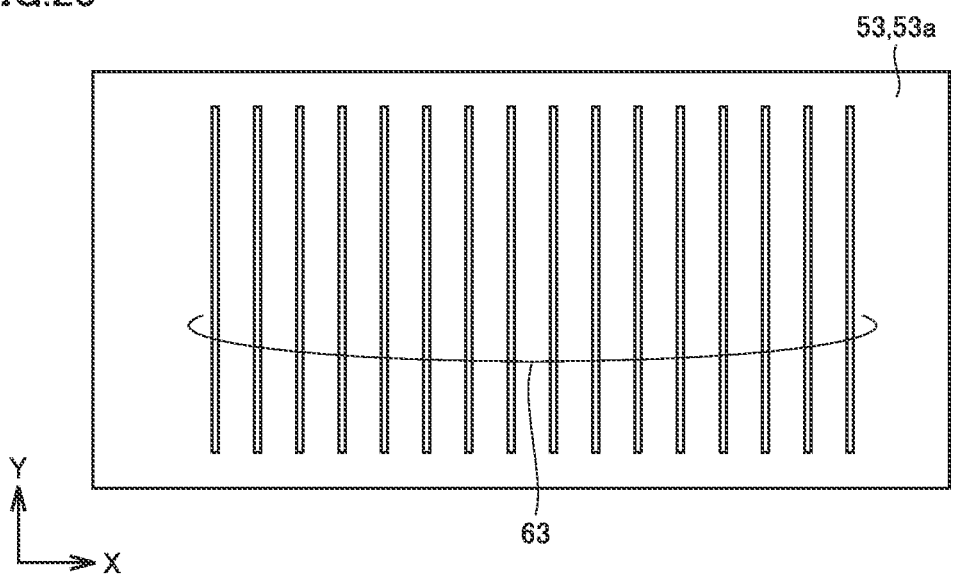
FIG. 23 is a bottom view illustrating a first modification of a structure of radiating fins in the heat sink in the first embodiment.
Figure 24:
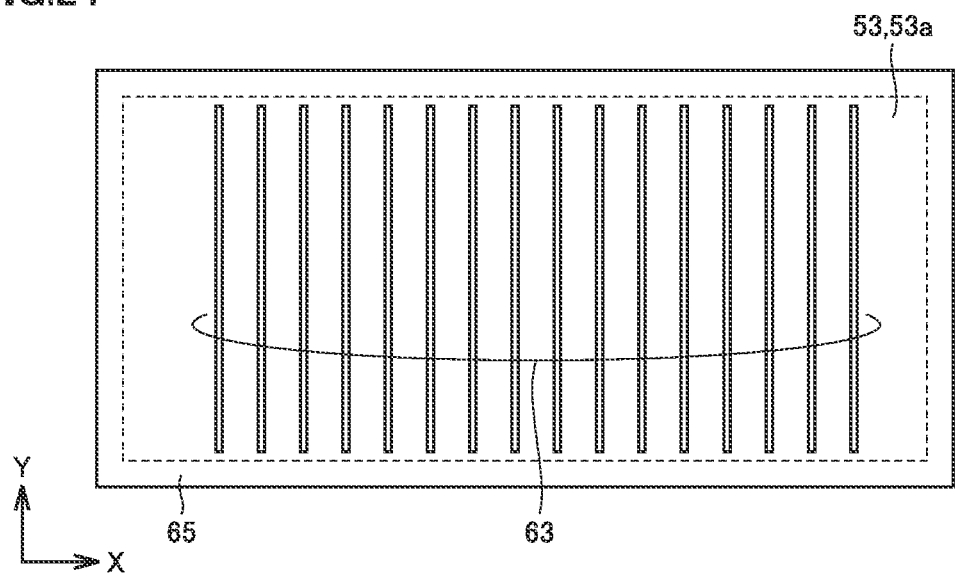
FIG. 24 is a bottom view for explaining the operation effect of the heat sink illustrated in FIG. 23 in the first embodiment.

Further, as a manner of arrangement of radiating fins 63 disposed in heat sink base unit 53, as illustrated in FIG. 23, radiating fins 63 may be disposed in a region other than an outer peripheral region located along the outer periphery of heat sink base unit 53. In this case, as illustrated in FIG. 24, the outer peripheral region in heat sink base unit 53 can function as a load-receiving portion 65 when crimping is performed.

Figure 25:
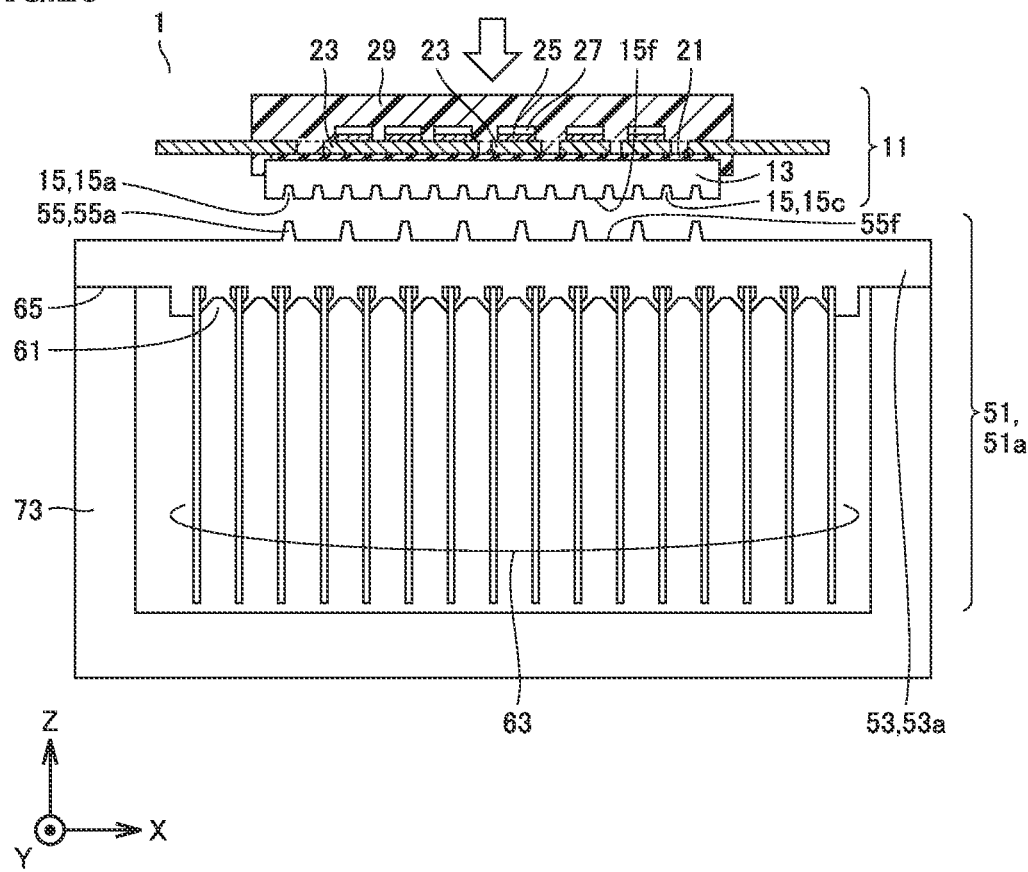
FIG. 25 is a side view including a partial cross section illustrating a step of the manufacturing method for explaining the operation effect of the heat sink illustrated in FIG. 23 in the first embodiment.

As illustrated in FIG. 25, after radiating fins 63 are crimped in heat sink base unit 53 by crimping, heat sink base unit 53 is placed in a heat sink setting jig 73. Then, power module unit 11 is pressed toward heat sink base unit 53 from above, whereby uneven portion 15 formed in module base 13 and uneven portion 55 formed in heat sink base unit 53 are fitted together, and power module unit 11 is bonded to heat sink base unit 53.

Figure 26:
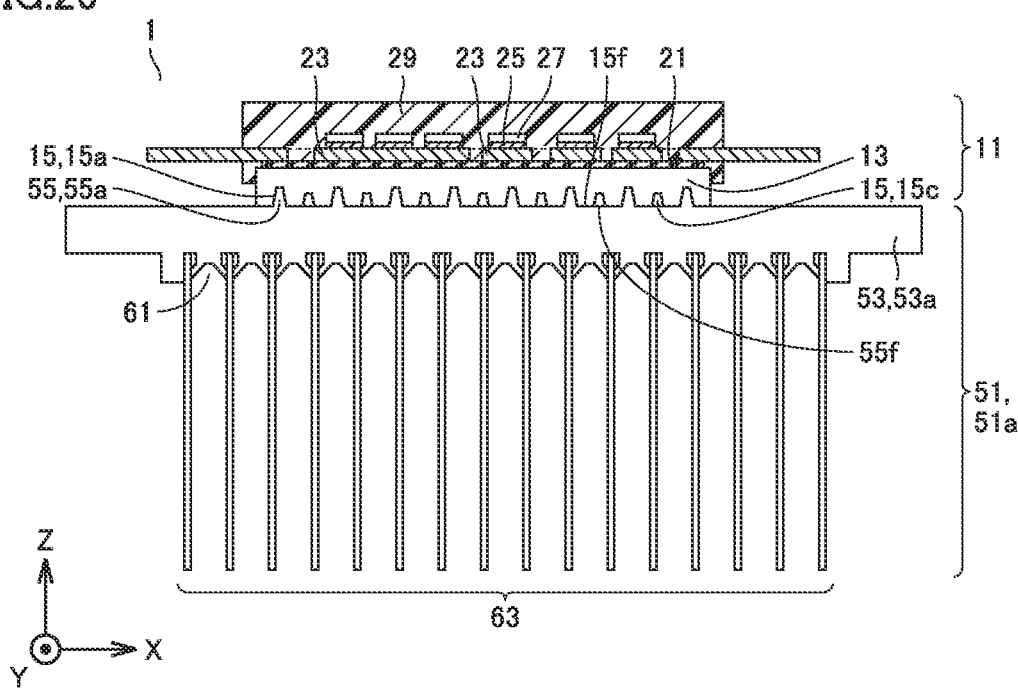
FIG. 26 is a side view including a partial cross section illustrating a step performed after the step illustrated in FIG. 24 for explaining the operation effect of the heat sink illustrated in FIG. 23 in the first embodiment.

Subsequently, heat sink setting jig 73 is removed, and as illustrated in FIG. 26, power semiconductor device 1 in which power module unit 11 and heat sink 51 (heat sink base unit 53) are integrated is produced. Since power module unit 11 and heat sink 51 are integrated using heat sink setting jig 73, the integration can be performed more readily and efficiently, compared with when heat sink setting jig 73 is not used.

Figure 27:
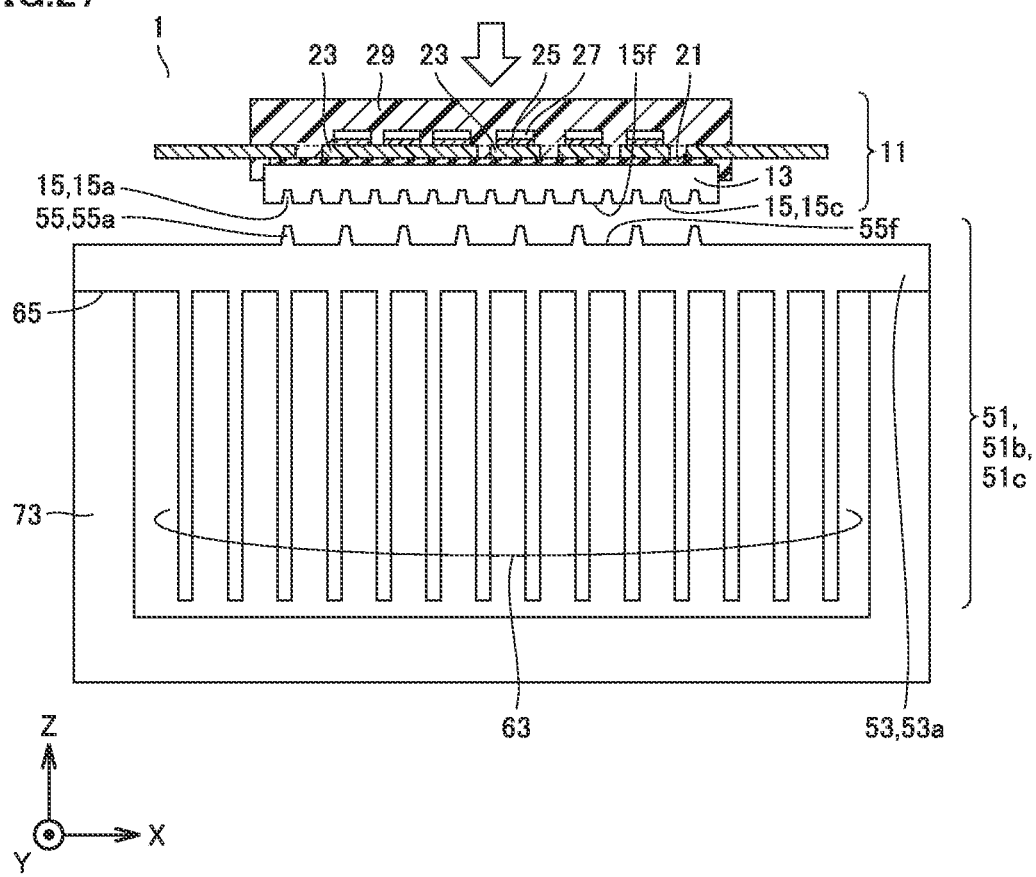
FIG. 27 is a side view including a partial cross section illustrating a step of the manufacturing method for explaining the operation effect of the heat sink illustrated in FIG. 21 in the first embodiment.

Heat sink setting jig 73 can also be applied when heat sink 51b, 51c in which radiating fins 63 and heat sink base unit 53 are integrally formed is used. As illustrated in FIG. 27, heat sink 51b, 51c in which radiating fins 63 and heat sink base unit 53 are integrally formed is placed in heat sink setting jig 73.

Then, power module unit 11 is pressed toward heat sink base unit 53 from above, whereby uneven portion 15 formed in module base 13 and uneven portion 55 formed in heat sink base unit 53 are fitted together, and power module unit 11 and heat sink base unit 53 are integrated.

Figure 28:
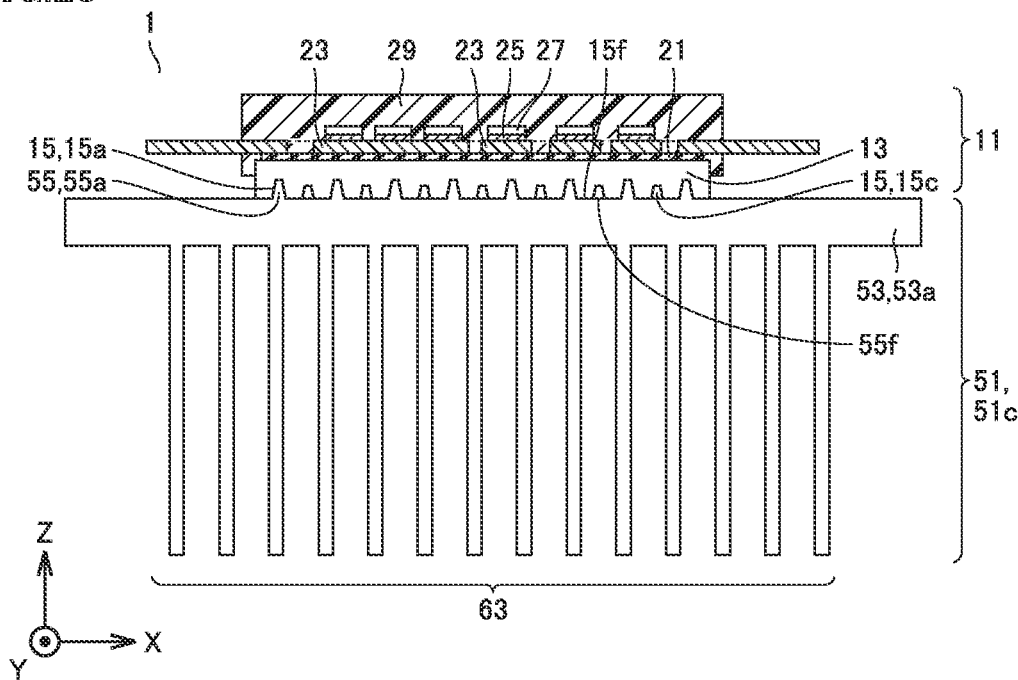
FIG. 28 is a side view including a partial cross section illustrating a step performed after the step illustrated in FIG. 27 for explaining the operation effect of the heat sink illustrated in FIG. 21 in the first embodiment.

Subsequently, heat sink setting jig 73 is removed, and as illustrated in FIG. 28, power semiconductor device 1 in which power module unit 11 and heat sink 51 integrated is produced. In the case of heat sink 51 in which radiating fins 63 and heat sink base unit 53 are integrally formed, heat sink setting jig 73 can be used to facilitate integration of power module unit 11 and heat sink 51.

In the case of heat sink 51b, 51c in which heat sink base unit 53 and radiating fins 63 are integrally formed, a jig with press blade 71 having a flat edge (not illustrated) may be used in place of press blade 71 illustrated in FIG. 5. In this case, power module unit 11 is pressed from above with the jig brought into contact with heat sink base unit 53, so that power module unit 11 can be bonded to heat sink base unit 53.

Figure 29:
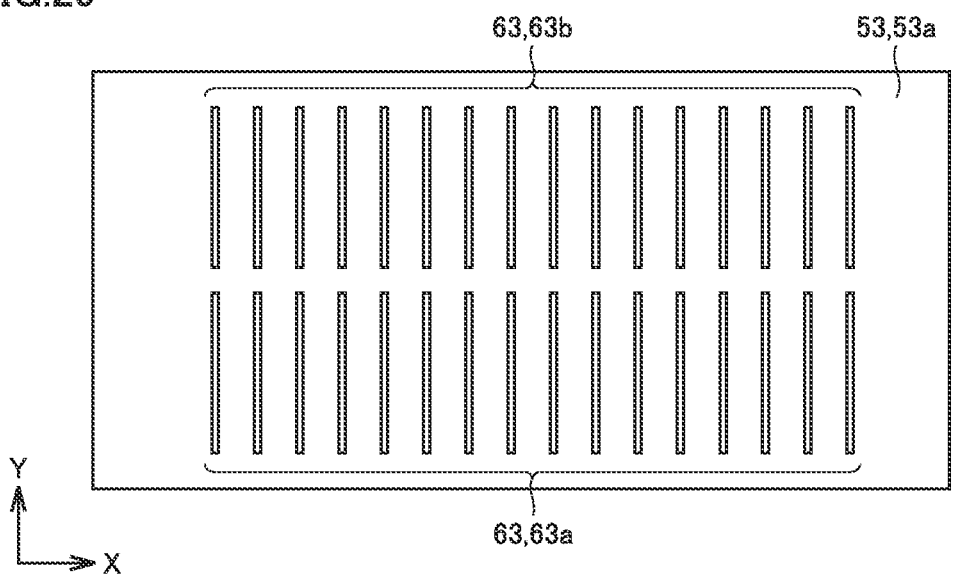
FIG. 29 is a bottom view illustrating a second modification of a structure of radiating fins in the heat sink in the first embodiment.

An example of radiating fin 63 formed uniformly along the Y-axis direction has been described (see FIG. 23). However, radiating fin 63 is not limited to this example. As illustrated in FIG. 29, radiating fin 63 may include a radiating fin 63a and a radiating fin 63b formed in a discontinuous manner along the Y-axis direction.

Figure 30:
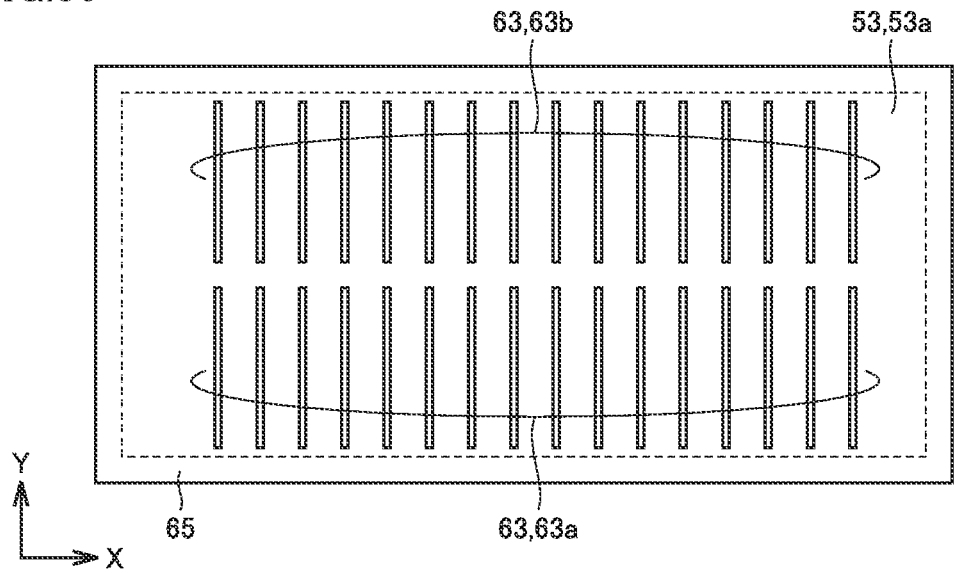
FIG. 30 is a bottom view for explaining the operation effect of the heat sink illustrated in FIG. 29 in the first embodiment.

Even in this case, as illustrated in FIG. 30, as an arrangement manner of radiating fins 63, it is preferable that radiating fins 63 are disposed except in an outer peripheral region located along the outer periphery of heat sink base unit 53, and the outer peripheral region in heat sink base unit 53 can function as load-receiving portion 65 when crimping is performed.

Figure 31:
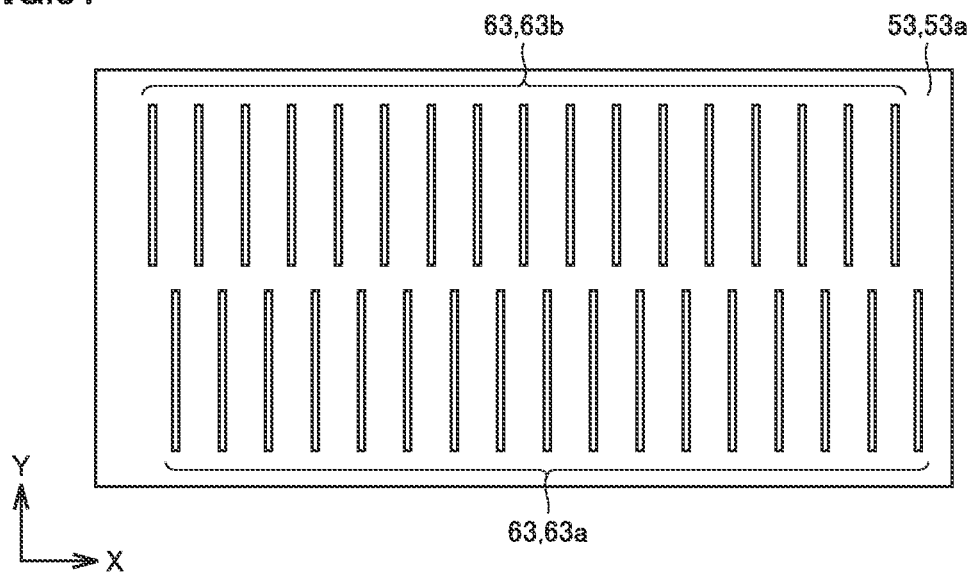
FIG. 31 is a bottom view illustrating a third modification of a structure of radiating fins in the heat sink in the first embodiment.
Figure 32:
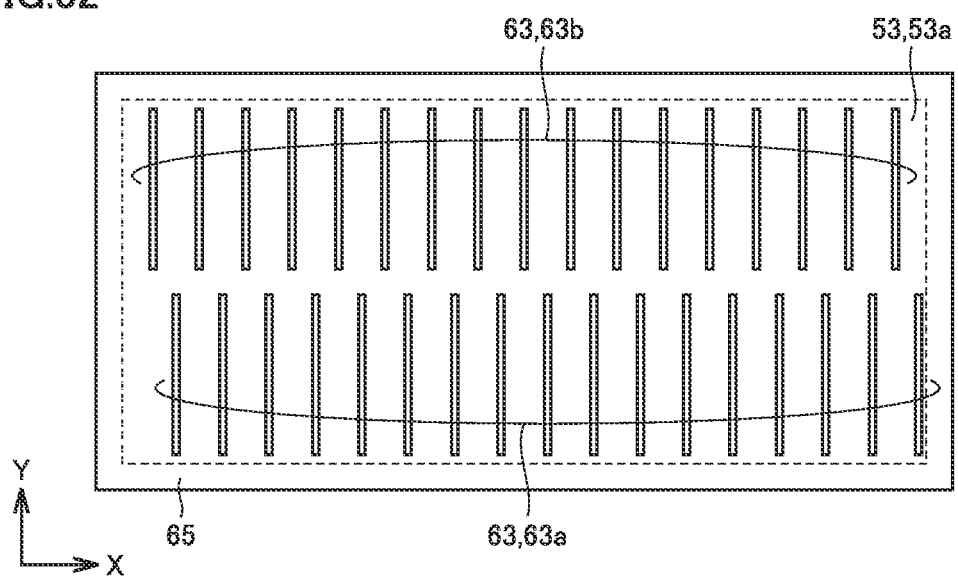
FIG. 32 is a bottom view for explaining the operation effect of the heat sink illustrated in FIG. 31 in the first embodiment.

Further, as illustrated in FIG. 31, radiating fins 63 may be disposed such that the position in the X-axis direction of radiating fin 63b is displaced from the position in the X-axis direction of radiating fin 63a. In this case, radiating fin 63b is located between radiating fin 63a and radiating fin 63a adjacent to each other, whereby the heat dissipation can be improved in power semiconductor device 1. As illustrated in FIG. 32, the outer peripheral region in heat sink base unit 53 can function as load-receiving portion 65 when crimping is performed.

In power semiconductor device 1 in which power module unit 11 and heat sink 51 are integrated, the size of module base 13 of power module unit 11 is uniquely set in power module unit 11 (mold). Therefore, when the heat density of heat generated in power semiconductor device 1 (power module unit 11) varies, the heat dissipation ability suitable for each heat density can be ensured by changing the size (width and depth), excluding the thickness, of heat sink base unit 53, the number of radiating fins 63, and the size of radiating fin 63.

In other words, heat sink 51 adaptable to various amounts of heat generation depending on the specifications for one power module unit 11 can be bonded to power module unit 11. Accordingly, commonization of power module unit 11 can be achieved, compared with the power semiconductor devices disclosed in PTL 1 to PTL 8, in which the mold unit formed of a mold resin and the module base unit have size restriction. This can contribute to improvement in productivity of power semiconductor device 1 (power module unit 11).

Figure 33:
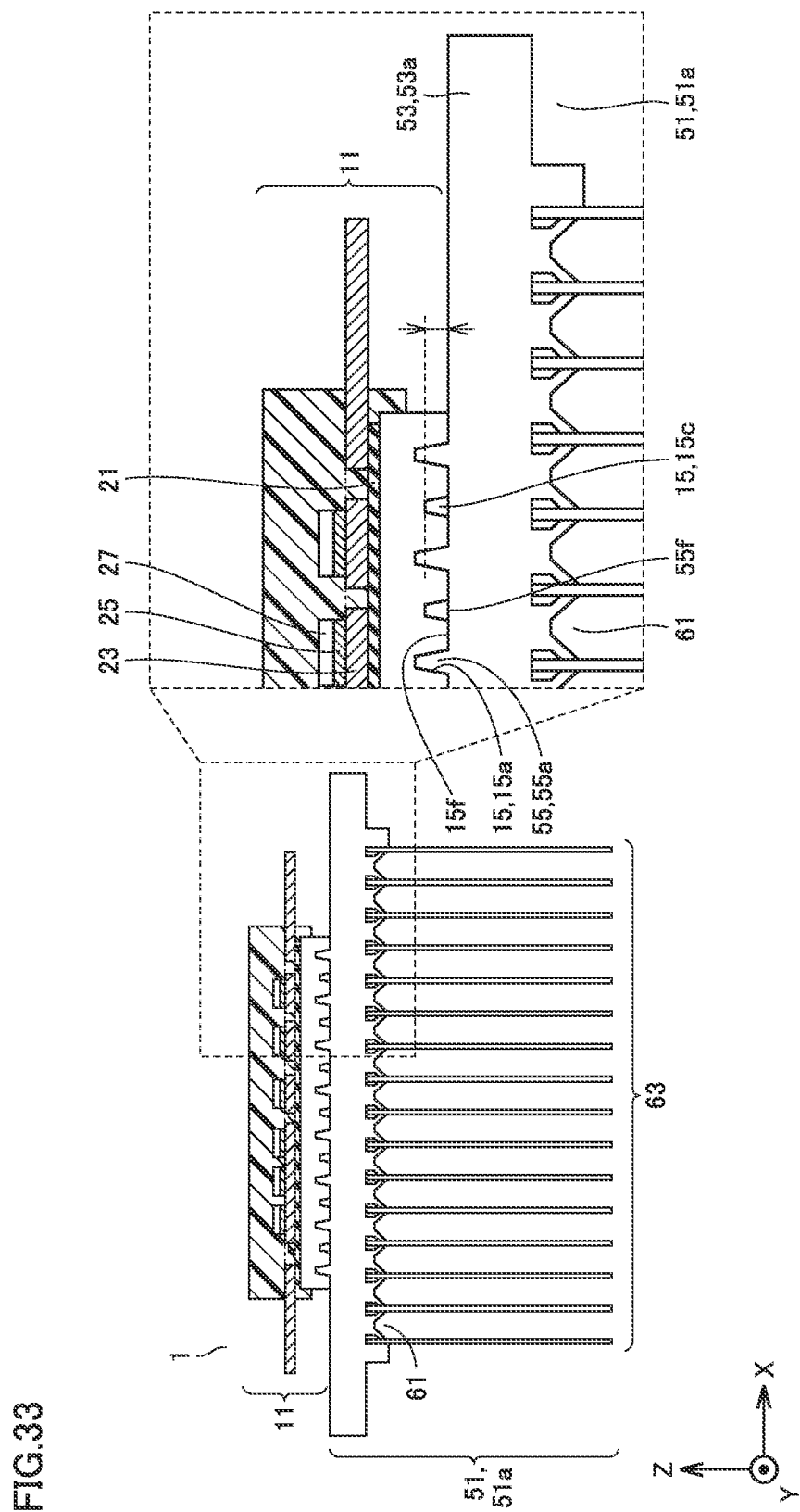
FIG. 33 is a side view including a partially enlarged view of the power semiconductor device and a partial cross section for explaining the operation effect of buffer depression portions in the first embodiment.

As illustrated in FIG. 33, in the finished power semiconductor device 1, buffer depression portion 15c is left as a space, and the quality of the heat sink crimping process can be determined from the state of the space formed. For example, power semiconductor device 1 is irradiated with light and the projection area is measured. The quality of the heat sink crimping process can be determined by estimating the height of the space from heat sink base unit 53 (see the dimension line). The provision of such a measurement tool enables the determination of the quality of the heat sink crimping process to be automatically performed.

Further, the air (air flow) can be fed into buffer depression portion 15c left as a space to contribute to dissipation of heat produced in power semiconductor device 1. In particular, a fan (not shown) can be used for forced air cooling to achieve a remarkable effect.

Second Embodiment

Figure 34:
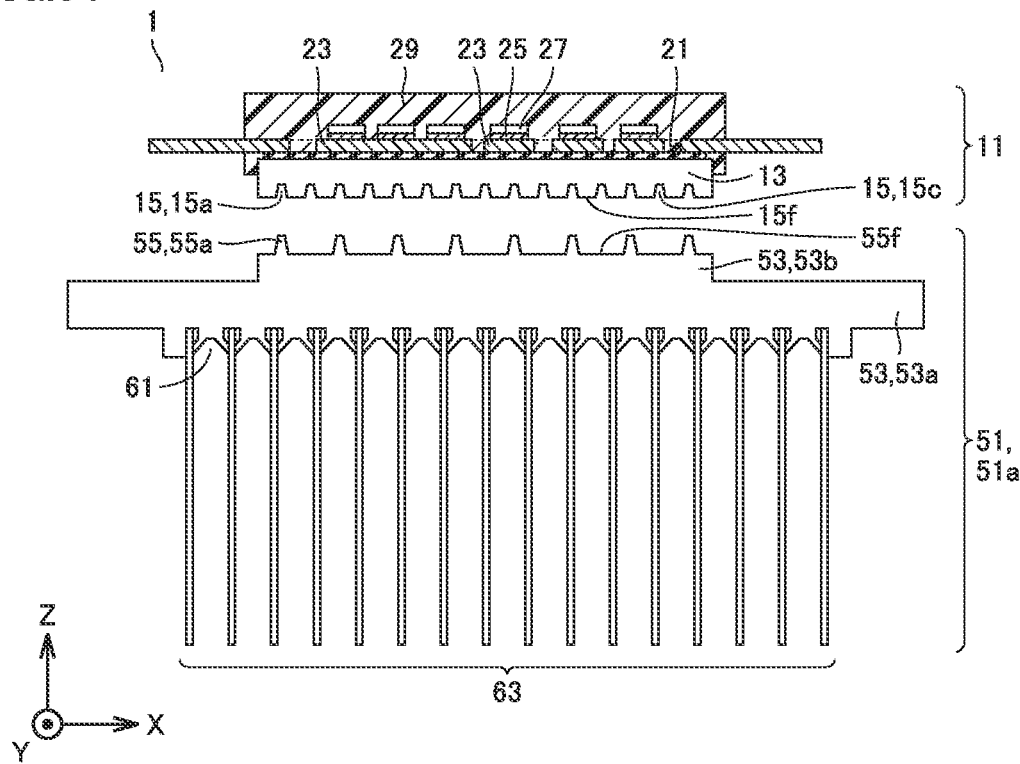
FIG. 34 is an exploded side view including a partial cross section of a power semiconductor device according to a second embodiment.

A power semiconductor device according to a second embodiment will be described. FIG. 34 is an exploded side view including a partial cross section of power semiconductor device 1, and FIG. 35 is a side view of power semiconductor device 1 in which power module unit 11 and heat sink 51 are integrated.

Figure 35:
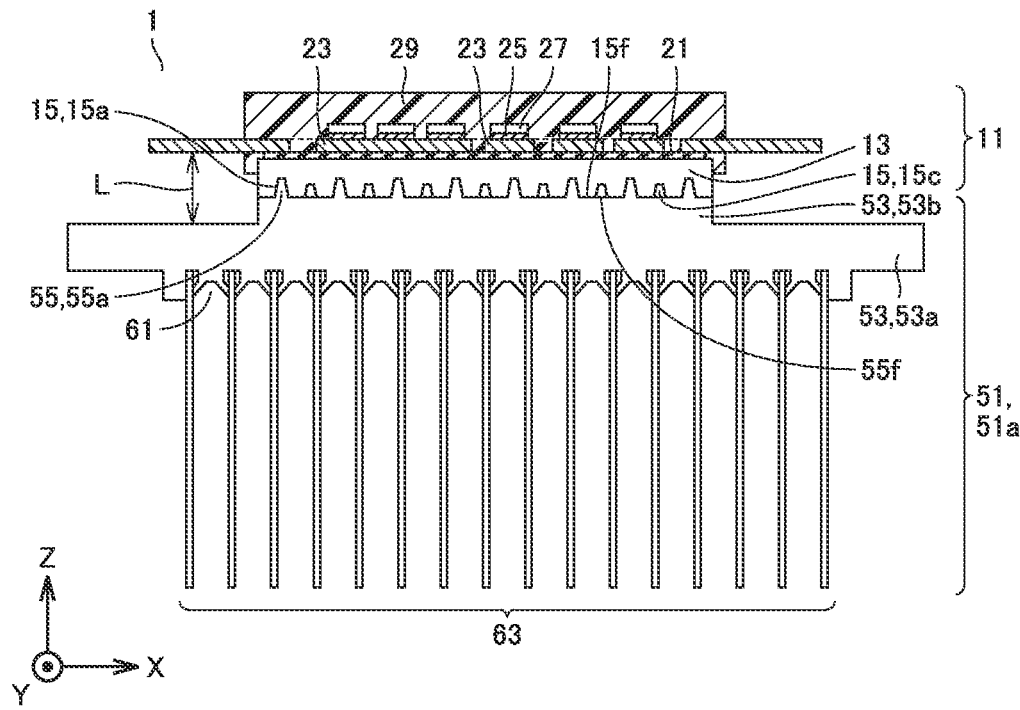
FIG. 35 is a side view including a partial cross section illustrating an exemplary state in which the power module unit and the heat sink are integrated in the second embodiment.

As illustrated in FIG. 34 and FIG. 35, heat sink base unit 53 in power semiconductor device 1 is composed of a heat dissipation spreader 53a and a raised portion 53b. Raised portion 53b is formed to protrude from heat dissipation spreader 53a toward power module unit 11. Except for this, the configuration is similar to the configuration of power semiconductor device 1 illustrated in FIG. 1 and the like, and the same members are denoted with the same reference signs and will not be further elaborated unless necessary.

In power semiconductor device 1 described above, the following effects can be achieved in addition to the effect of productivity improvement because of the formation of buffer depression portions 15c. In power semiconductor device 1, raised portion 53b is formed to protrude from heat dissipation spreader 53a toward power module unit 11. This configuration can ensure an insulation distance L between lead frame 23 protruding from mold resin 29 in power module unit 11 and heat dissipation spreader 53a of heat sink base unit 53.

Heat sink base unit 53 is produced by machining, forging, extruding, or die casting, and raised portion 53b is formed simultaneously with the production of heat sink base unit 53. The thickness (height) of raised portion 53b therefore can be set freely, and the required insulation distance L can be easily ensured according to the specifications without impairing the productivity.

Figure 36:
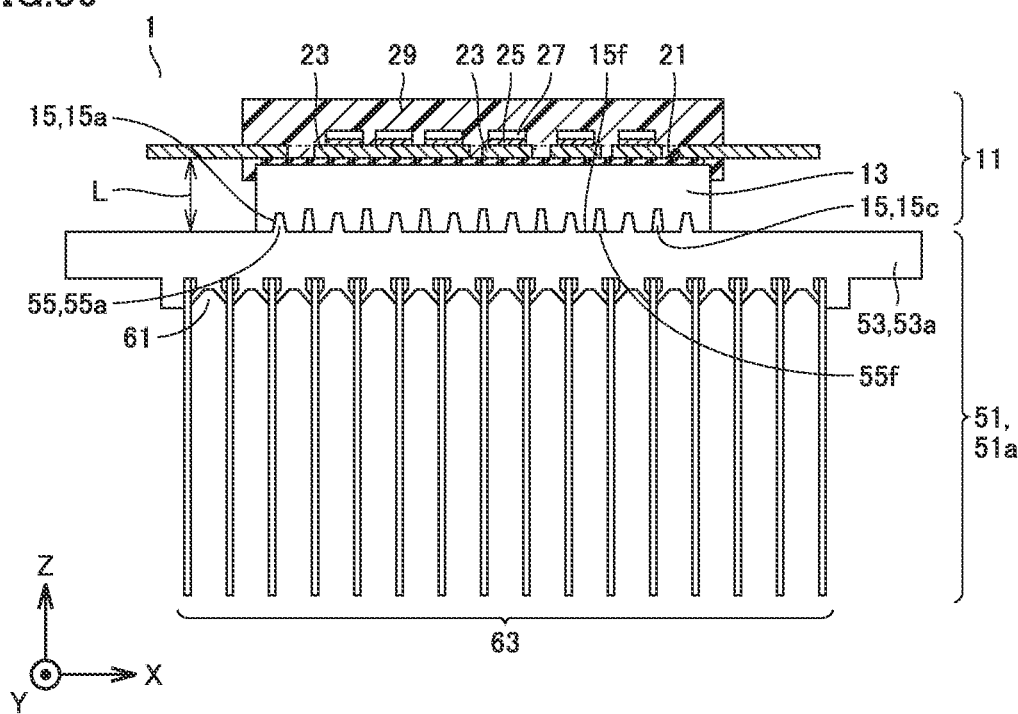
FIG. 36 is a side view including a partial cross section illustrating another exemplary state in which the power module unit and the heat sink are integrated in the second embodiment.

As illustrated in FIG. 36, the thickness of module base 13 may be increased as a method of ensuring the insulation distance L between lead frame 23 and heat dissipation spreader 53a. In this case, as the thickness of module base 13 increases, the heat capacity of module base 13 increases. Therefore, considering the productivity in forming mold resin 29, it is preferable to ensure the insulation distance L by forming raised portion 53b on heat dissipation spreader 53a.

The uneven shape in such a manner that depression portions 15a are formed in flat portion 15f has been described as uneven portion 15 formed in module base 13, and the uneven shape in such a manner that projection portions 55a are formed in flat portion 55f has been described as uneven portion 55 formed in heat sink base unit 53 (heat dissipation spreader 53a). The uneven shape may be formed such that projection portions are formed in a flat portion in module base 13, and the uneven shape may be formed such that depression portions are formed in a flat portion in heat sink base unit 53. In this case, the uneven shape in heat sink base unit 53 has buffer depression portions.

Third Embodiment

Here, a power conversion device to which power semiconductor device 1 described in the foregoing first or second embodiment is applied will be described. Although the present disclosure is not limited to any particular power conversion device, the application of the present disclosure to a three-phase inverter will be described below as a third embodiment.

Figure 37:
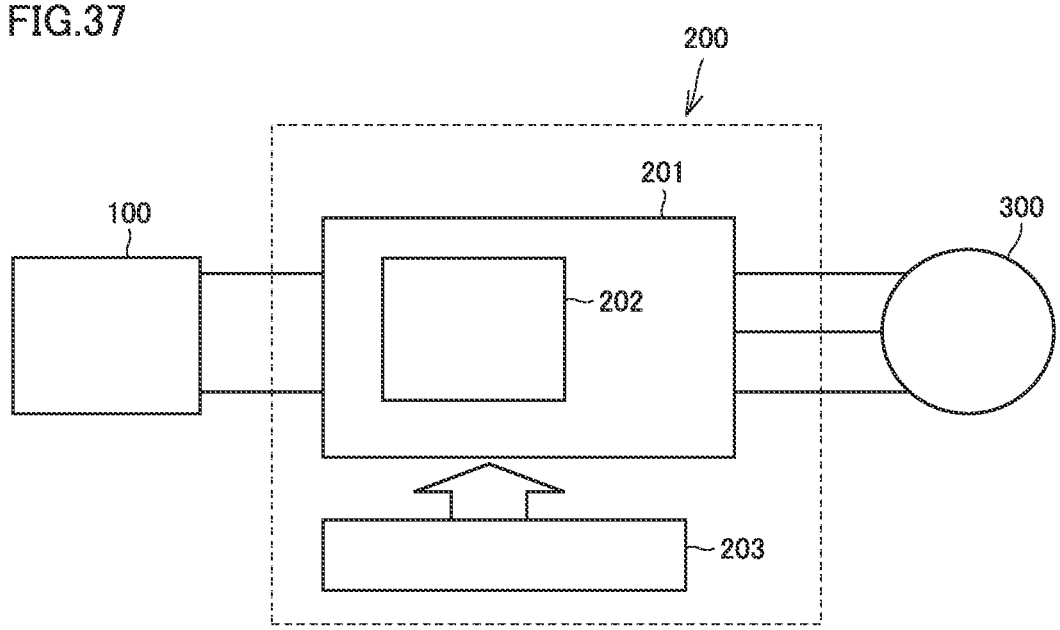
FIG. 37 is a block diagram of a power conversion device to which the power semiconductor device is employed according to a third embodiment.

FIG. 37 is a block diagram illustrating a configuration of a power conversion system to which the power conversion device according to the present embodiment is applied. The power conversion system illustrated in FIG. 37 includes a power source 100, a power conversion device 200, and a load 300. Power source 100 is a DC power source and supplies DC power to power conversion device 200. Power source 100 can be configured with various kinds of power sources, for example, can be configured with a DC system, a solar battery, or a storage battery. Alternatively, it may be configured with a rectifying circuit or an AC/DC converter connected to an AC system. Power source 100 may be configured with a DC/DC converter that converts a DC power output from a DC system into a prescribed power.

Power conversion device 200 is a three-phase inverter connected between power source 100 and load 300 and converts a DC power supplied from power source 100 into an AC power and supplies the AC power to load 300. As illustrated in FIG. 37, power conversion device 200 includes a main conversion circuit 201 to convert a DC power into an AC power and output the AC power, and a control circuit 203 to output a control signal for controlling main conversion circuit 201 to main conversion circuit 201.

Load 300 is a three-phase motor driven by an AC power supplied from power conversion device 200. Load 300 is not limited to any particular applications and is a motor installed in a variety of electrical instruments and used as, for example, a motor for hybrid vehicles, electric vehicles, railroad vehicles, elevators, or air conditioners.

The detail of power conversion device 200 will be described below. Main conversion circuit 201 includes switching elements (not illustrated) and freewheeling diodes (not illustrated). The switching elements perform switching whereby a DC power supplied from power source 100 is converted into an AC power to be supplied to load 300. There are a variety of specific circuit configurations of main conversion circuit 201. Main conversion circuit 201 according to the present embodiment may be a two-level three-phase full bridge circuit and include six switching elements and six freewheeling diodes connected in anti-parallel with the corresponding switching elements.

In at least any one of the switching elements and the freewheeling diodes of main conversion circuit 201, power semiconductor device 1 according to the foregoing first or second embodiment is formed as semiconductor module 202. Six switching elements are connected in series two by two to form upper and lower arms, and the upper and lower arms constitute each phase (U phase, V phase, W phase) of the full bridge circuit. The output terminals of the upper and lower arms, that is, three output terminals of main conversion circuit 201 are connected to load 300.

Main conversion circuit 201 includes a drive circuit for driving each switching element. The drive circuit may be contained in semiconductor module 202 or the drive circuit may be provided separately from semiconductor module 202. The drive circuit generates a drive signal for driving a switching element of main conversion circuit 201 and supplies the drive signal to the control electrode of the switching element of main conversion circuit 201. Specifically, a drive signal to turn on a switching element and a drive signal to turn off a switching element are output to the control electrode of each switching element, in accordance with the control signal from control circuit 203 described later. When the switching element is kept ON, the drive signal is a voltage signal (ON signal) equal to or higher than a threshold voltage of the switching element. When the switching element is kept OFF, the drive signal is a voltage signal (OFF signal) equal to or lower than a threshold voltage of the switching element.

Control circuit 203 controls the switching elements of main conversion circuit 201 such that a desired power is supplied to load 300. Specifically, the time (ON time) in which each switching element of main conversion circuit 201 is to be turned ON is calculated based on a power to be supplied to load 300. For example, main conversion circuit 201 can be controlled by PWM control that modulates the ON time of switching elements in accordance with the voltage to be output. A control command (control signal) is output to the drive circuit of main conversion circuit 201 such that an ON signal is output to a switching element to be turned ON and an OFF signal is output to a switching element to be turned OFF, at each point of time. The drive circuit outputs an ON signal or an OFF signal as a drive signal to the control electrode of each switching element, in accordance with the control signal.

In the power conversion device according to the present embodiment, power semiconductor device 1 described in the first or second embodiment is applied as semiconductor module 202 to at least any one of the switching elements and the freewheeling diodes of main conversion circuit 201. This can contribute to improvement in productivity of the power conversion device.

In the present embodiment, an example in which the present disclosure is applied to a two-level three-phase inverter has been described. However, the present disclosure is not limited thereto and can be applied to a variety of power conversion devices. The present disclosure is applied to a two-level power conversion device in the present embodiment but may be applied to a three-level or multi-level power conversion device. When a power is supplied to a single-phase load, the present invention can be applied to a single-phase inverter. When a power is supplied to a DC load or the like, the present disclosure can also be applied to a DC/DC converter or an AC/DC converter.

The power conversion device to which the present disclosure is applied is not limited to the case in which the load is a motor, and may be used as a power supply device for electric discharge machines, laser processing machines, induction heating cookers, or wireless charging systems, or may be used as a power conditioner for photovoltaic systems or power storage systems.

The power semiconductor devices described in the embodiments can be combined if necessary.

Embodiments disclosed here are illustrative and not intended to be limitative. The present disclosure is shown not by the scope described above but by the claims, and all equivalents to the claims and modifications within the scope of the claims are intended to be embraced.

INDUSTRIAL APPLICABILITY

The present disclosure is effectively utilized in a heat sink-integrated power semiconductor device in which a power module and a heat sink are integrated.

REFERENCE SIGNS LIST 1 power semiconductor device, 11 power module unit, 13 module base, 15 uneven portion, 15a, 15b depression portion, 15c buffer depression portion, 15f flat portion, 17 uneven portion, 17a, 17b projection portion, 17f flat portion, 21 insulating sheet, 23 lead frame, 25 solder, 27 chip, 29 mold resin, 51, 51a, 51b, 51c heat sink, 53 heat sink base unit, 53a heat dissipation spreader, 53b raised portion, 55 uneven portion, 55a, 55b projection portion, 55f flat portion, 57 uneven portion, 57a, 57b depression portion, 57c buffer depression portion, 57f flat portion, 61 fin crimp portion, 63 radiating fin, 63a, 63b radiating fin, 65 load-receiving portion, 71 press blade, 73 heat sink setting jig.

The invention claimed is:

1. A power semiconductor device comprising:
a power module unit having a module base having a first uneven portion, the power module unit having a power semiconductor element mounted on the module base and sealed by a sealing material;
a heat sink base unit having a second uneven portion and bonded to the module base such that the second uneven portion and the first uneven portion are fitted together; and
a plurality of radiating fins attached to the heat sink base unit,
wherein the module base and the heat sink base unit are formed such that one of the first uneven portion and the second uneven portion has a buffer depression portion left as a space in a state in which the module base and the heat sink base unit are bonded to each other.

2. The power semiconductor device according to claim 1, wherein
the heat sink base unit includes a heat dissipation spreader to which the radiating fins are attached, and
the second uneven portion is formed in the heat dissipation spreader.

3. The power semiconductor device according to claim 1, wherein
the heat sink base unit includes
a heat dissipation spreader to which the radiating fins are attached, and
a raised portion raised from the heat dissipation spreader toward a side on which the power module unit is located, and
the second uneven portion is formed in the raised portion.

4. The power semiconductor device according to claim 1, wherein
the first uneven portion is formed to extend in a first direction, and
the second uneven portion is formed to extend in the first direction.

5. The power semiconductor device according to claim 4, wherein the first uneven portion and the second uneven portion have a discontinuous portion.

6. The power semiconductor device according to claim 1, wherein at least one buffer depression portion is disposed between one depression portion and another depression portion adjacent to each other in the first uneven portion and the second uneven portion fitted together.

7. The power semiconductor device according to claim 1, wherein the radiating fins are each disposed to extend in a second direction and are spaced apart from each other in a third direction intersecting the second direction.

8. The power semiconductor device according to claim 7, wherein
the radiating fins include
a plurality of radiating fin first portions each extending in the second direction, and
a plurality of radiating fin second portions each extending in the second direction and spaced apart from the radiating fin first portions in the second direction.

9. The power semiconductor device according to claim 8, wherein a position in the third direction of each of the radiating fin first portions and a position in the third direction of each of the radiating fin second portions are displaced from each other.

10. The power semiconductor device according to claim 1, wherein the radiating fins are disposed in a region other than a region located in an outer periphery of the heat sink base unit.

11. A power conversion device comprising:
a main conversion circuit having the power semiconductor device according to claim 1, the main conversion circuit converting input power and outputting the converted power; and
a control circuit to output a control signal for controlling the main conversion circuit to the main conversion circuit.

12. A method of manufacturing a power semiconductor device, the method comprising the steps of:
preparing a module base having a first uneven portion;
forming a power module unit by mounting a power semiconductor element on the module base and sealing the power semiconductor element by a sealing material such that the first uneven portion is exposed;

preparing a heat sink base unit having a second uneven portion to be fitted to the first uneven portion; and integrating the module base and the heat sink base unit by placing the first uneven portion and the second uneven portion to face each other, pressing one of the module base in the power module unit and the heat sink base unit against the other, and fitting the first uneven portion and the second uneven portion together, wherein in the step of preparing a module base and the step of preparing a heat sink base unit, one of the first uneven portion and the second uneven portion has a buffer depression portion left as a space in a state in which the module base and the heat sink base unit are bonded to each other.

13. The method of manufacturing a power semiconductor device according to claim 12, wherein the step of preparing a heat sink base unit includes the step of preparing the heat sink base unit having radiating fin insertion grooves and crimp portions on a side opposite to a side to which the power module unit is bonded, a plurality of radiating fins being inserted into the radiating fin insertion grooves, the crimp portions crimping the radiating fins inserted in the radiating fin insertion grooves, the step of integrating the module base and the heat sink base unit includes the steps of:

placing the first uneven portion and the second uneven portion to face each other and disposing the radiating fins in the corresponding radiating fin insertion grooves; and bringing a crimping jig into contact with the crimp portions and pressing the heat sink base unit toward the module base to fit the first uneven portion and the second uneven portion together, and crimping the crimp portions to attach the radiating fins to the heat sink base unit and integrate the module base, the heat sink base unit, and the radiating fins.

14. The method of manufacturing a power semiconductor device according to claim 12, wherein the step of preparing a heat sink base unit includes the step of preparing the heat sink base unit having a plurality of radiating fins integrally disposed on a side opposite to a side to which the power module unit is bonded, the step of integrating the module base and the heat sink base unit includes the steps of:

disposing the heat sink base unit in a heat sink setting jig;

disposing the power module unit such that the first uneven portion faces the second uneven portion of the heat sink base unit disposed in the heat sink setting jig; and pressing the power module unit toward the heat sink base unit to fit the first uneven portion and the second uneven portion together.

* * * * *